US007532679B2

United States Patent
Staszewski et al.

(10) Patent No.: US 7,532,679 B2
(45) Date of Patent: May 12, 2009

(54) HYBRID POLAR/CARTESIAN DIGITAL MODULATOR

(75) Inventors: Robert B. Staszewski, Garland, TX (US); Oren E. Eliezer, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 581 days.

(21) Appl. No.: 11/203,019

(22) Filed: Aug. 11, 2005

(65) Prior Publication Data

US 2006/0038710 A1     Feb. 23, 2006

Related U.S. Application Data

(60) Provisional application No. 60/601,376, filed on Aug. 12, 2004.

(51) Int. Cl.
    *H04L 27/00* (2006.01)
    *H04L 27/36* (2006.01)
    *H04L 23/00* (2006.01)

(52) U.S. Cl. .................. 375/295; 375/298; 375/377

(58) Field of Classification Search ............... 375/295, 375/377, 298
See application file for complete search history.

(56) References Cited

U.S. PATENT DOCUMENTS

| 7,072,420 | B2* | 7/2006 | Persson | 375/297 |
| 2002/0196864 | A1* | 12/2002 | Booth et al. | 375/296 |

OTHER PUBLICATIONS

B. Schafferer, R. Adams, "A 3V CMOS 400mW 14b 1.4GS/s DAC for Multi-Carrier Applications", 2004 IEEE International Solid-State Circuits Conference, Section 20.1.

P. Eloranta, P. Seppinen, Direct-Digital RF Modulator IC in 0.13 μm CMOS for Wide-Band Multi-Radio Applications, 2005 IEEE International Solid-State Circuits Conference, Section 29.2.

V.W. Leung, L.E. Larson, P.S. Gudem, "Improved Digital-IF Transmitter Architecture for Highly Integrated W-CDMA Mobile Terminals", IEEE Trans. on Vehicular Tech., vol. 54, No. 1, Jan. 2005, pp. 20-32.

S. Luschas, R. Schreier, H.S. Lee, "Radio Frequency Digital-to-Analog Converter", IEEE J. of Solid-State Circuits, vol. 39, No. 9, Sep. 2004, pp. 1462-1467.

J. Vankka, J. Sommarek, J. Ketola, I. Teikari, K.A.I. Halonen, "A Digital Quadrature Modulator With On-Chip D/A Converter", IEEE J. of Solid-State Circuits, vol. 38, No. 10, Oct. 2003, pp. 1635-1638.

\* cited by examiner

*Primary Examiner*—Tesfaldet Bocure
(74) *Attorney, Agent, or Firm*—Ronald O. Neerings; Wade James Brady, III; Frederick J. Telecky, Jr.

(57) ABSTRACT

A novel apparatus and method for a hybrid Cartesian/polar digital QAM modulator. The hybrid technique of the present invention utilizes a combination of an all digital phase locked loop (ADPLL) that features a wideband frequency modulation capability and a digitally controlled power amplifier (DPA) that features interpolation between 90 degree spaced quadrature phases. This structure is capable of performing either a polar operation or a Cartesian operation and can dynamically switch between them depending on the instantaneous value of a metric measured by a thresholder/router. In this manner, the disadvantages of each modulation technique are avoided while the benefits of each are exploited.

43 Claims, 20 Drawing Sheets

HYBRID POLAR/CARTESIAN DIGITAL MODULATOR

REFERENCE TO RELATED APPLICATIONS

This application claims priority to U.S. Provisional Application Ser. No. 60/601,376, filed Aug. 12, 2004, entitled "Hybrid of Polar/Cartesian Method for Digital QAM Modulation", incorporated herein by reference in its entirety.

FIELD OF THE INVENTION

The present invention relates to the field of data communications and more particularly relates to an apparatus for and method of hybrid polar/Cartesian digital quadrature modulation.

BACKGROUND OF THE INVENTION

The cellular phone industry continues to thrive by providing support for Bluetooth personal area networking, positioning technology based on GPS and wireless LAN for high-speed local-area data access. Sophisticated applications, such as MP3 audio playback, camera functions, MPEG video and digital TV further entice a new wave of handset replacements. Such application support dictates a high level of memory integration together with large digital signal processing horsepower and information flow management, all requiring sophisticated DSP and microprocessor cores. To keep cost and power dissipation down, as well as to constrain growth of printed circuit board (PCB) real estate, the entire radio, including memory, application processor (AP), digital baseband (DBB) processor, analog baseband and RF circuits would ideally be all integrated onto a single silicon die with a minimal number of external components.

Currently, the DBB and AP designs invariably migrate to the most advanced deep-submicron digital CMOS process available, which usually does not offer any analog extensions and has very limited voltage headroom. Design flow and circuit techniques of contemporary transceivers for multi-GHz cellular applications are typically analog intensive and utilize process technologies that are incompatible with DBB and AP processors. The use of low-voltage deep-submicron CMOS processes allows for an unprecedented degree of scaling and integration in digital circuitry, but complicates implementation of traditional RF circuits. Furthermore, any mask adders for RF/analog circuits are not acceptable from fabrication cost standpoint. Consequently, a strong incentive has arisen to find digital architectural solutions to the RF functions. One approach to reduce the cost, area and power consumption of the complete mobile handset solutions is through integration of the conventional RF functions with the DBB and AP.

Quadrature amplitude modulation (QAM) is a modulation technique in widespread use today. A block diagram illustrating a prior art Cartesian architecture QAM modulator with I and Q baseband signals is shown in FIG. 1. The modulator, generally referenced 10, comprises a coder 12, I and Q TX pulse-shaping filters 14, 16, cos and sin multipliers of a local oscillator clock 18, 20 and adder/summing node 22. In operation, the input bit stream $b_k$ is converted by the coder to I (real) and Q (imaginary) symbols. These are pulse-shaped and the resulting baseband signals are multiplied by the cos and sin clock signals of the local oscillator to generate in-phase and quadrature phase components, respectively. These are combined to generate the output RF signal x(t). Note that this Cartesian modulation scheme could be implemented digitally, which is desirable considering the benefits of digital implementation of circuitry typically implemented in analog.

Complex modulation may also be generated using a polar modulation scheme to substitute for the quadrature modulation of FIG. 1. A circuit diagram illustrating prior art polar complex modulation based on direct phase and amplitude modulation is shown in FIG. 2. The circuit, generally referenced 30, comprises a coder 32, I and Q TX filters 34, 36, polar coordinate converter 38, local oscillator 40 and multiplier 42.

In operation, the bits $b_k$ to be transmitted are input to the coder, which functions to generate I (real) and Q (imaginary) symbols therefrom according to the targeted communications standard. The I and Q symbols are pulse-shaped and the resulting baseband signals are converted to phase (Ang$\{s(t)\}$), and magnitude (Mag$\{s(t)\}$) baseband signals by the polar coordinate converter 38. The phase data is used to control the local oscillator 40 to generate the appropriate frequency signal, which is multiplied in multiplier/mixer 42 by the magnitude data resulting in the output RF signal x(t). Note that this polar modulation scheme is better suited for digital implementation.

Considering an all-digital implementation, the local oscillator 40 can be made extremely accurate. By nature, the polar architecture natively operates in the frequency domain where the frequency is the derivative of the phase with respect to time. Depending on the type of modulation implemented, the change in frequency $\Delta f$ from one command cycle to another can be very large for sudden phase reversals that occur near the origin in the I/Q domain representing the complex envelope. Considering a WCDMA system, for example, a plot of $\Delta f$ versus time is shown in FIG. 3A. Most of the time, the frequency deviation is reasonably small. The dashed lines represent the threshold point whereby the frequency deviation $\Delta f$ is outside of the dashed lines approximately 0.3% of the time. The polar modulator cannot easily handle such large swings in $\Delta f$ due to the inherent construction of the polar modulator, which is a limitation of the polar structure addressed by the present invention.

The conventional Cartesian modulator, on the other hand, operates natively in the phase domain and avoids handling the large swings in frequency. A disadvantage of this scheme, however, is in its difficulty to achieve high resolution compared to the polar scheme. Additionally, amplitude and phase mismatches of the I and Q paths result in the modulation distortion.

The polar modulation scheme, however, lends itself well to implementation using deep submicron CMOS technology. A problem arises when this scheme is applied to WCDMA applications which generate frequency deviations $\Delta f$ that are too large for the polar modulator to handle.

Thus, there is a need for a modulator structure that (1) combines the advantageous features of both the Cartesian and polar schemes, (2) avoids the disadvantages of both Cartesian and polar modulators, (3) is well suited for implementation in deep submicron CMOS processes, and (4) is able to handle the large $\Delta f$ swings generated in WCDMA and other advanced modulation schemes.

SUMMARY OF THE INVENTION

The present invention provides a solution to the problems of the prior art by providing an apparatus for a hybrid Cartesian/polar digital modulator. The hybrid technique of the present invention utilizes a combination of an all-digital phase locked loop (ADPLL) that features a wideband frequency modulation capability and a digitally controlled quadrature power amplifier (DPA) that features interpolation capability between 90 degree spaced quadrature phases. This structure is capable of performing either a polar operation or a Cartesian operation and can dynamically switch between them depending on the instantaneous value of the phase change. Since the large frequency deviations are relatively infrequent (e.g., 0.1-1% depending on the threshold set), the transmitter presented herein predominantly operates in the polar domain with the Cartesian operations being considered exceptions. In this manner, the disadvantages of each modulation technique are avoided while the benefits of each are exploited.

Note that many aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is therefore provided in accordance with the invention, a method of hybrid polar/Cartesian modulation, the method comprising the steps of receiving I and Q input signals representing data to be transmitted, generating a frequency control word and amplitude control word from the I and Q input signals, determining a metric and comparing the metric to a threshold and performing either polar modulation or Cartesian modulation on the input signal in accordance with the comparison.

There is also provided in accordance with the invention, an apparatus for hybrid polar/Cartesian modulation comprising a converter adapted to generate first frequency control data and first amplitude control data word from I and Q input signals representing data to be transmitted, a digitally controlled oscillator (DCO) operative to generate four quadrature phases in response to the first frequency command data, a transistor array comprising a plurality of transistors adapted to generate an output signal whose amplitude is substantially proportional to the number of transistors active at any one time in the array, a switch matrix adapted to couple the four quadrature phases output of the DCO to the transistor array, a router adapted to receive the first frequency command data, the first amplitude command data and the I and Q input signals, the router operative to select either polar operation or Cartesian operation and to generate second frequency command data and second amplitude command vector data in response thereto and control means coupled to the cordic and the switch array, the control means operative to control the switch matrix to dynamically switch between polar and Cartesian modulation in accordance with the second amplitude command vector data.

There is further provided in accordance with the invention, a modulator for hybrid polar/Cartesian modulation comprising phase locked loop (PLL) means for generating quadrature phase signals in response to a frequency command and digital power amplifier (DPA) means for generating a radio frequency (RF) output signal in accordance with the quadrature phase signals and for dynamically switching between polar modulation operation and Cartesian modulation operation in accordance with the value of a metric based on the frequency command.

There is also provided in accordance with the invention, a modulator for hybrid polar/Cartesian modulation comprising a digital phase locked loop (DPLL) adapted to generate quadrature phase clock signals, a router adapted to receive a first frequency command data, a first amplitude command data and I and Q input signals, the router operative to select either polar modulation operation or Cartesian modulation operation and to generate second frequency command data and second amplitude command vector data in response thereto and a digital power amplifier (DPA) comprising an array of switch elements operative to generate an RF output signal proportional to the number of switch elements at any point in time, a switch matrix coupled to the output of the DPLL and to the array of switch elements, the switch matrix operative to couple each quadrature phase clock signal to the array of switch elements in accordance with a plurality of control signals and a control unit adapted to generate the plurality of control signals in accordance with second amplitude command vector data, wherein the control unit adapted to dynamically switch between polar modulation operation and Cartesian modulation operation in response to the second amplitude command vector data.

There is further provided in accordance with the invention, a multi-mode radio for use with a plurality of modulation schemes comprising means for realizing a polar modulation mode of operation, means for realizing a Cartesian modulation mode of operation, means for realizing a hybrid polar/Cartesian modulation mode of operation wherein polar or Cartesian modulation is dynamically selected based on the value of a metric compared to a threshold and control means for selecting one of the polar modulation, the Cartesian modulation or the hybrid polar/Cartesian modulation modes of operation in accordance with a selected modulation scheme.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
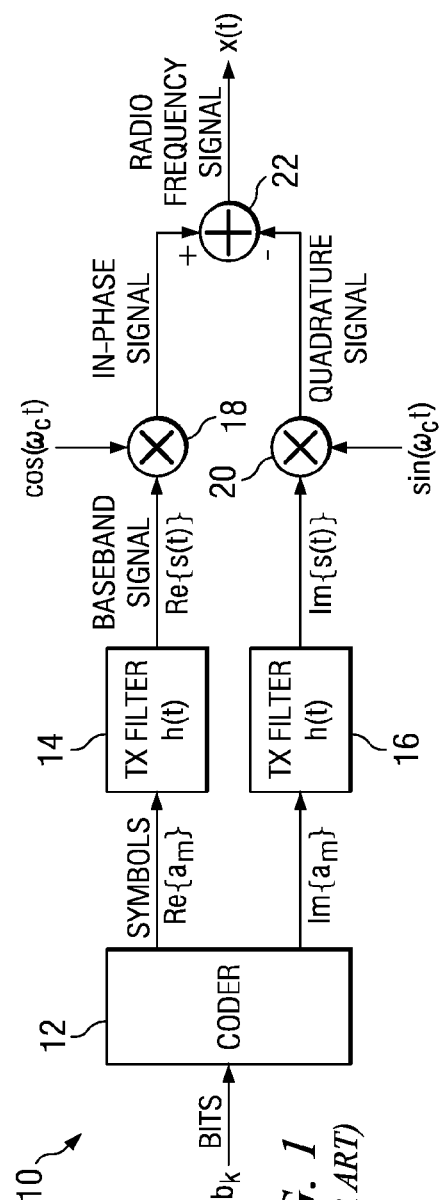
FIG. 1 is a block diagram illustrating a prior art Cartesian (QAM) modulator with I and Q baseband signals.
Figure 2:
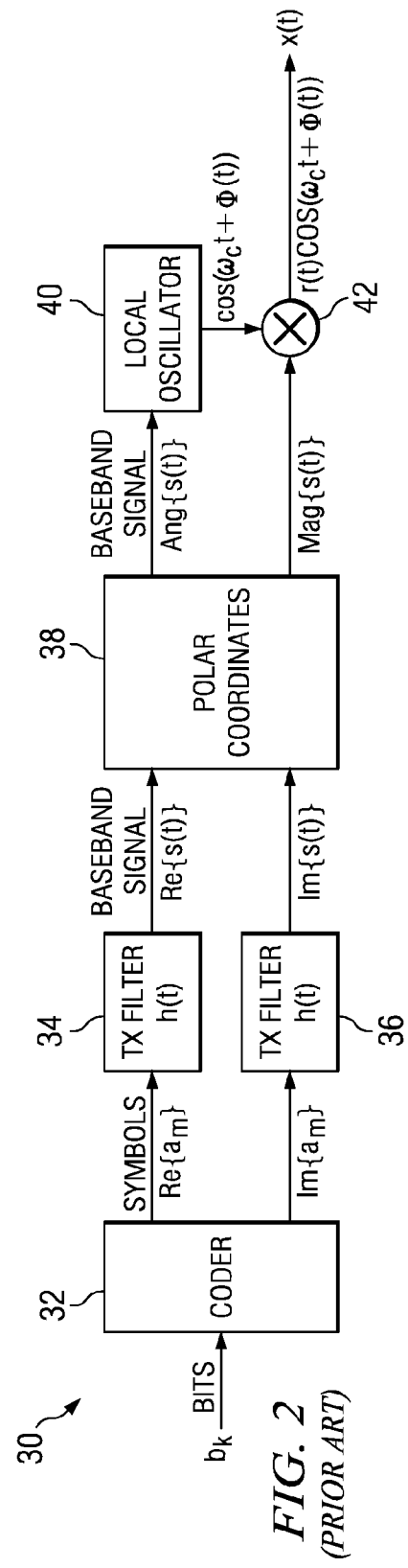
FIG. 2 is a block diagram illustrating a prior art complex polar modulator with direct phase and amplitude modulation.

The following notation is used throughout this document.

| Term | Definition |
| --- | --- |
| AC | Alternating Current |
| ACW | Amplitude Control Word |
| ADPLL | All Digital Phase Locked Loop |
| AM | Amplitude Modulation |
| AP | Application Processor |
| ASIC | Application Specific Integrated Circuit |
| CDMA | Code Division Multiple Access |
| CKR | Retimed Reference Clock |
| CKV | Variable Oscillator Clock |
| CMOS | Complementary Metal Oxide Semiconductor |
| CORDIC | COordinate Rotation DIgital Computer |
| CU | Control Unit |
| DAC | Digital to Analog Converter |
| DBB | Digital Baseband |
| DC | Direct Current |
| DCO | Digitally Controlled Oscillator |
| DCXO | Digitally Controlled Crystal Oscillator |
| DEM | Dynamic Element Matching |
| DFC | Digital to Frequency Conversion |
| DPA | Digital Power Amplifier |
| DRAC | Digital to RF Amplitude Converter |
| DRP | Digital RF Processor or Digital Radio Processor |
| DSP | Digital Signal Processor |
| ECL | Emitter Coupled Logic |
| EDGE | Enhanced Data rates for Global Evolution |
| FCW | Frequency Command Word |
| FPGA | Field Programmable Gate Array |
| FREF | Frequency Reference |
| G/G/E | GSM/GPRS/EDGE |
| GPS | Global Positioning System |
| GSM | Global System for Mobile Communication |
| RB | High Band |
| HDL | Hardware Description Language |
| IC | Integrated Circuit |
| LAN | Local Area Network |
| LB | Low Band |
| LO | Local Oscillator |
| LSB | Least Significant Bit |
| MOS | Metal Oxide Semiconductor |
| MOSCAP | Metal Oxide Semiconductor Capacitor |
| MP3 | MPEG Audio Layer 3 |
| MPEG | Moving Picture Experts Group |
| nMOS | n-channel Metal Oxide Semiconductor |
| OCP | Open Core Protocol |
| OTW | Oscillator Tuning Word |
| PA | Power Amplifier |
| PCB | Printed Circuit Board |
| PLL | Phase Locked Loop |
| PM | Phase Modulation |
| pMOS | p-channel Metal Oxide Semiconductor |
| PPA | Pre-Power Amplifier |
| PVT | Process Voltage Temperature |
| QAM | Quadrature Amplitude Modulation |
| RF | Radio Frequency |
| RFBIST | RF Built In Self Test |
| RFC | RF Choke |
| RMS | Root Mean Squared |
| SAW | Surface Acoustic Wave |
| SoC | System on Chip |
| TDC | Time-to-Digital Converter |
| UWB | Ultra Wideband |
| VCO | Voltage Controlled Oscillator |
| WCDMA | Wideband Code Division Multiple Access |
| WLAN | Wireless Local Area Network |

Detailed Description of the Invention

The present invention is an apparatus for and a method of a hybrid polar/Cartesian digital modulator for use in a digital RF processor (DRP). The invention is intended for use in a radio transmitter and transceiver but can be used in other applications as well, such as a general communication channel. The present invention provides a solution to the problems of the prior art by providing a modulation scheme that combines polar and Cartesian modulation and avoids the disadvantages of each. The hybrid polar/Cartesian digital modulator structure is presented in the context of a direct digital-to-RF amplitude converter (DRAC), which incorporates a digital power amplifier (DPA) circuit for efficiently combining I/Q input signals, D/A conversion, filtering, buffering and RF output amplitude control into a single circuit.

To aid in understanding the principles of the present invention, the description is provided in the context of a digital to RF amplitude converter (DRAC) that serves as the final stage of an all-digital polar transmitter IC for WCDMA. In one example embodiment, the circuit combines an all-digital phase locked loop (ADPLL) that features a wideband frequency modulation capability and a digitally controlled power amplifier (DPA) that features interpolation between 90 degree spaced quadrature phases. This circuit is capable of performing either a polar operation or a Cartesian operation and can dynamically switch between them depending on the instantaneous value of the phase change or some other correlated signal. A router performs thresholding and routing functions whereby the frequency or frequency/amplitude information from the COordinate Rotation DIgital Computer (CORDIC) (i.e. a converter from I/Q to magnitude and phase) is used to select either polar or Cartesian modulation. The circuit avoids the disadvantages of each modulation technique while the benefits of each are exploited.

It is appreciated by one skilled in the art that the hybrid polar/Cartesian modulation scheme of the present invention can be adapted to comply with numerous other wireless communications standards such as EDGE, extended data rate Bluetooth, WCDMA, Wireless LAN (WLAN), Ultra Wideband (UWB), etc. It is appreciated, however, that the invention is not limited for use with any particular communication standard (wireless or otherwise) and may be used in optical, wired and wireless applications. Further, the invention is not limited for use with a specific modulation scheme but is applicable to other complex amplitude modulation schemes as well.

The term transmit buffer is intended to include a transmit buffer as well as various amplifier circuits such as pre-power amplifier, low power amplifier, high power amplifier, etc. and it not intended to be limited by the amount of power produced.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof.

Digital RF Processor Overview

Figure 4:
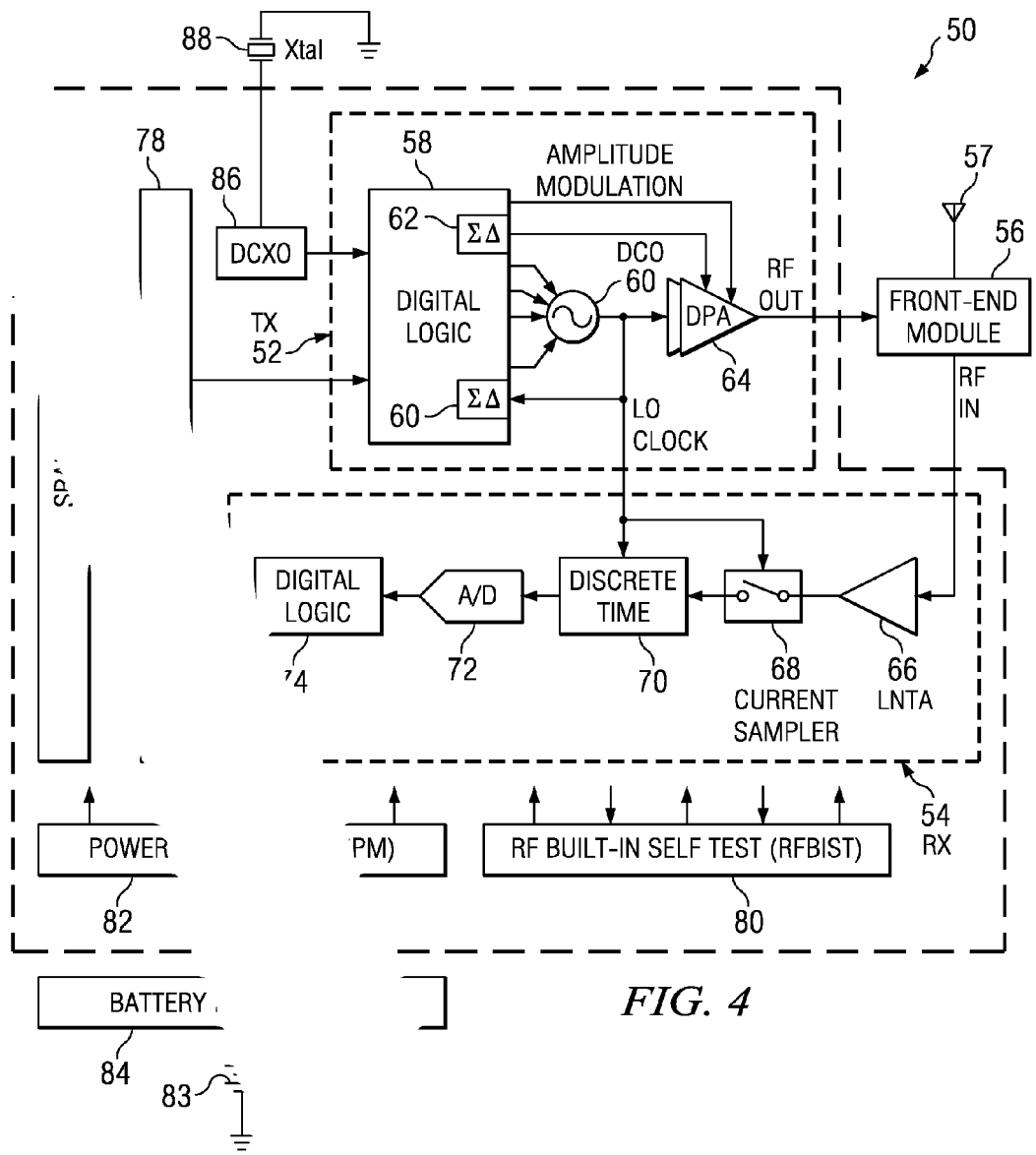
FIG. 4 is a block diagram illustrating a single-chip GSM/EDGE transceiver with an all-digital local oscillator and transmitter, and a discrete-time receiver.

A block diagram illustrating a single-chip GSM/EDGE radio with an all-digital local oscillator and transmitter, and a discrete-time receiver is shown in FIG. 4. The radio, generally referenced 50, comprises a digital baseband (DBB) processor 78, memory 76, TX block 52, RX block 54, crystal 88 and crystal oscillator 86, front-end module 56 and antenna 57, power management unit 82, RF built-in self test 80, battery 83 and battery management circuit 84. The TX block comprises digital logic block 58 including $\Sigma\Delta$ modulators 60, 62, digitally controlled oscillator (DCO) 60 and digital power amplifier (DPA) 64. The RX block comprises a low noise transconductance amplifier 66, current sampler 68, discrete time block 70, A/D converter 72 and digital logic block 74.

FIG. 4 provides an overview of key circuits of a single-chip GSM/EDGE radio, with the local oscillator and transmitter described in more detail infra. A key component is the digitally controlled oscillator (DCO) 60, which avoids any analog tuning controls. Fine frequency resolution is achieved through high-speed $\Sigma\Delta$ dithering of its varactors. Digital logic built around the DCO realizes an all-digital PLL (ADPLL) that is used as a local oscillator for both the transmitter and receiver. The polar transmitter architecture utilizes the wideband direct frequency modulation capability of the ADPLL and a digitally controlled power amplifier (DPA) 64 for the amplitude modulation. The DPA operates in near-class-E mode and uses an array of nMOS transistor switches to regulate the RF amplitude. It is followed by a matching network and an external front-end module 56, which comprises a power amplifier (PA) and a transmit/receive switch for the common antenna 57. Fine amplitude resolution is achieved through high-speed $\Sigma\Delta$ dithering of the DPA nMOS transistors.

The receiver 54 employs a discrete-time architecture in which the RF signal is directly sampled at the Nyquist rate of the RF carrier and processed using analog and digital signal processing techniques. The transceiver is integrated with a dedicated DBB processor 78 and SRAM memory 76. The frequency reference (FREF) is generated on-chip by a 26 MHz digitally controlled crystal oscillator (DCXO) 86. The integrated power management (PM) 82 consists of multiple low-dropout (LDO) voltage regulators that also isolate supply noise between circuits. The RF built-in self-test (RFBIST) 80 performs autonomous phase noise and modulation distortion testing as well as various loopback configurations for bit-error-rate measurements. Almost all the clocks on this SoC are derived from and are synchronous to the RF oscillator clock. This helps to reduce susceptibility to the noise generated through clocking of the massive digital logic.

RF Transmitter in Deep-Submicron CMOS

A paradigm facing analog and RF designers of deep-submicron CMOS circuits is presented herein. In a deep-submicron CMOS process, time-domain resolution of a digital signal edge transition is superior to voltage resolution of analog signals. A successful design approach in this environment would exploit the paradigm by emphasizing (1) fast switching characteristics of MOS transistors: high-speed clocks and/or fine control of timing transitions; (2) high density of digital logic (250 kgates/mm$^2$ in this process) makes digital functions extremely inexpensive; and (3) small device geometries and precise device matching made possible by the fine lithography. While avoiding (1) biasing currents that are commonly used in analog designs; (2) reliance on voltage resolution; and (3) nonstandard devices that are not needed for memory and digital circuits.

Figure 5:
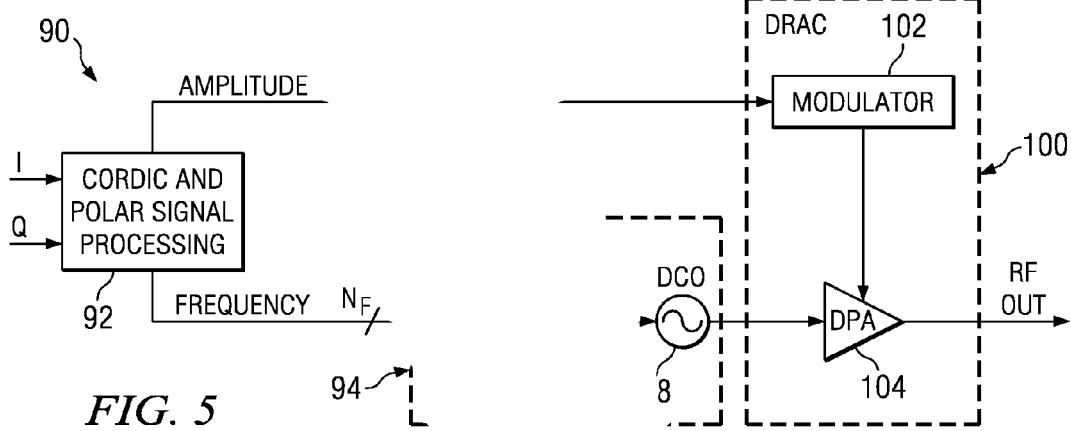
FIG. 5 is a block diagram illustrating a polar transmitter based on digitally-controlled oscillator (DCO) and a digitally-controlled power amplifier (DPA) circuits.

A block diagram illustrating a polar transmitter based on digitally controlled oscillator (DCO) and a digitally controlled power amplifier (DPA) circuits is shown in FIG. 5. For clarity, the all-digital PLL around the DCO is not shown. The circuit, generally referenced 90, comprises a COordinate Rotation DIgital Computer (CORDIC) and polar signal processing block 92, DRAC 100 and digital to frequency conversion (DFC) 94. The circuit 90 illustrates an application of the new paradigm to an RF wireless transmitter performing an arbitrary quadrature amplitude modulation (QAM). The low cost of digital logic allows for sophisticated digital signal processing. The small and well-matched devices allow for precise high-resolution conversions from digital to analog domains. The use of ultra high-speed clocks, i.e., high oversampling ratios, serves to eliminate the need for subsequent dedicated reconstruction filtering of spectral replicas and switching transients, so that the natural filtering of an oscillator (1/s due to the frequency-to-phase conversion), matching network of the power amplifier and antenna filter are sufficient. Since the converters utilize DCO clocks that are of high spectral purity, the sampling jitter is very small. The conversion functions described in this document are phase/frequency and amplitude modulations of an RF carrier realized using digitally controlled oscillator (DCO) and a digitally controlled power amplifier (DPA) circuits, respectively. They are digitally intensive equivalents of the conventional voltage-controlled oscillator (VCO) supporting frequency modulation and power amplifier driver circuits of controllable gain and/or a mixer for amplitude modulation. Due to the fine feature size and high switching speed of the modern CMOS technology employed, the respective digital-to-frequency conversion (DFC) and digital-to-RF-amplitude conversion (DRAC) transfer functions can be made very linear and of high dynamic range.

The selected architecture of the transmitter is polar. The I and Q samples of the Cartesian coordinate system generated in the digital baseband (DBB) are converted into amplitude and phase samples of the polar coordinate system using a CORDIC algorithm. The phase is then differentiated to obtain frequency deviation. The polar signals are subsequently conditioned through signal processing to sufficiently increase the sampling rate in order to reduce the quantization noise density and lessen the effects of the modulating spectrum replicas. The frequency deviation output signal is fed into the DCO-based $N_F$-bit DFC, which produces the phase modulated (PM) digital carrier:

$$y_{PM}(t)=sgn(\cos(\omega_0 t+\theta[k])) \quad (1)$$

where sgn(x)=1 for x≧0 and sgn(x)=−1 for x<0, $\omega_0=2\pi f_0$ is the angular RF carrier frequency and θ[k] is the modulating baseband phase of the $k^{th}$ sample. The phase $\Delta(t)=\int_{-\infty}^{t} f(t)dt$ is an integral of frequency deviation, where $t=k\cdot T_0$ with $T_0$ begin the sampling period.

The amplitude modulation (AM) signal controls the envelope of the phase-modulated carrier by means of the DPA-based $N_A$-bit DRAC. Higher-order harmonics of the digital carrier are filtered out by a matching network so that the sgn( ) operator is dropped. The composite DPA output contains the desired RF output spectrum.

$$y_{RF}(t)=a[k]\cdot\cos(\omega_0 t+\theta[k]) \quad (2)$$

where a[k] is the modulating baseband amplitude of the $k^{th}$ sample.

Despite their commonalities there are important differences between the two conversion functions of Equations 1 and 2. Due to the narrowband nature of the communication system, the DFC operating range is small but has a fine resolution. The DRAC operating range, on the other hand, is almost full scale, but not as precise. In addition, the phase modulating path features an additional 1/s filtering caused by the frequency-to-phase conversion of the oscillator. The signal processing and delay between the AM and PM paths should be matched, otherwise the recombined composite signal will be distorted. The matching of process, voltage and temperature (PVT) changes is guaranteed by the clock-cycle accurate characteristics of digital circuits. The group delay of the DCO and DPA circuits is relatively small in comparison with the tolerable range.

The DFC and DRAC are key functions of the all-digital transmitter that do not use any current biasing or dedicated analog continuous-time filtering in the signal path. In order to improve matching, linearity, switching noise and operational speed, the operating conversion cells (bit to frequency or RF carrier amplitude) are mainly realized as unit weighted. Their architectures are presented infra.

Spectral replicas of the discrete-time modulating signal appear across the frequency axis at the DCO and DPA inputs at integer multiples of the sampling rate frequency $f_R$. They are attenuated through multiplication of the $sinc^2$ function due to the zero-order hold of the DCO/DPA input. The frequency spectrum $S_f(\omega)$ replicas are further attenuated by 6 dB/octave through the 1/s operation of the oscillator to finally appear at the RF output phase spectrum $S_\phi(\omega)$. The sampling rate of $f_R=26$ MHz is high enough for the replicas to be sufficiently attenuated, thus making the RF signal undistinguishable from that created by conventional transmitters with continuous-time filtering at baseband. Contrarily, the spectral replicas of the amplitude modulation caused by the discrete-time nature of the digital input to the DPA circuitry are only suppressed by the zero-order hold function and therefore typically require additional treatment (e.g., digital or analog filtering) to be sufficiently suppressed to desired levels.

Generic Modulator

The two modulators in FIG. 5 could be considered a digital front-end of a generic digital-to-analog converter (DAC), where 'analog' denotes either the frequency or RF carrier amplitude. For the reasons stated above, the cell elements of the physical converters are unit weighted. Consequently, the simplest realization of the modulator is a binary-to-unit-weighted converter.

Unfortunately, the above arrangement is not practical because of the limited resolution of the conversion process. For example, the 12 kHz frequency step of the DFC is not adequate for GSM modulation where the peak frequency deviation is 67.7 kHz. Likewise for the amplitude modulation, the 6-bit amplitude resolution is too coarse as well.

Figure 6:
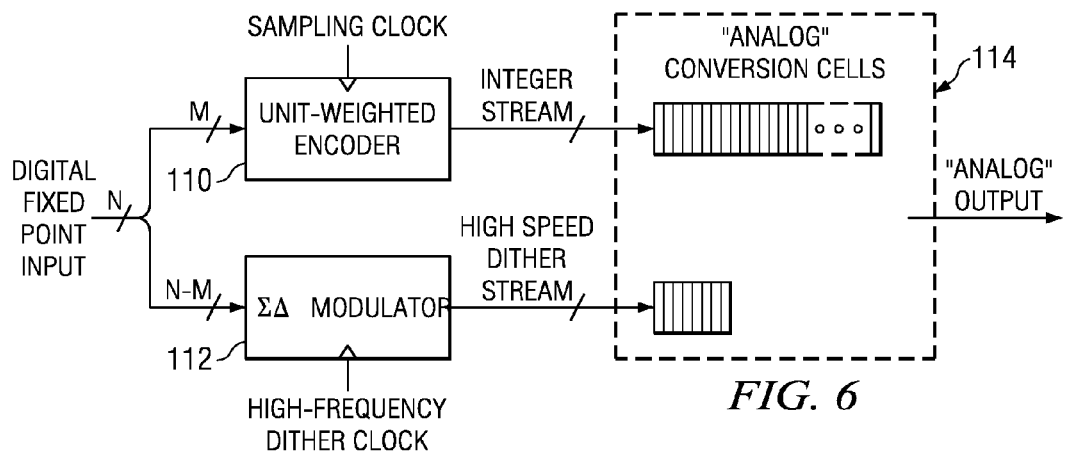
FIG. 6 is a block diagram illustrating the use of dithered elements in the digital modulator, acting as a digital to amplitude converter (DAC), to enhance its resolution beyond what is achieved within the integer portion of this DAC.

A block diagram illustrating the digital modulator as part of a digital to amplitude converter (DAC) is shown in FIG. 6. In this scheme, finer conversion resolution is achieved through high-speed dithering of the finest conversion cell elements via ΣΔ modulator 112. The N-bit digital fixed-point input is split into M integer (higher-order) bits and N-M fractional (lower-order) bits. The integer word sets the number of activated conversion elements and is fed to a unit-weighted encoder 110. The fractional word is fed to a ΣΔ modulator 112 that produces a high-speed integer stream whose average value is equal to the fractional word. The integer and high-speed dither stream are fed to 'analog' conversion cells which functions to generate the 'analog' output.

It is noted that in this DAC architecture, the lower-rate wide-bandwidth integer stream is never merged in digital domain with the higher-rate fractional stream and the final stream addition is done in the device cell domain. In this manners, the high-speed operation is constrained to a small portion of the circuit, thus reducing current consumption.

Digitally Controlled Oscillator

Figure 7:
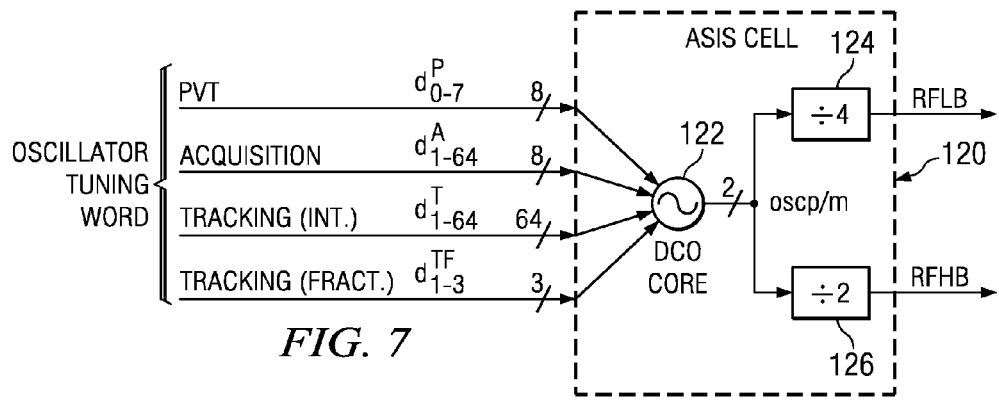
FIG. 7 is a block diagram illustrating the DCO and high-band and low-band dividers implemented as an ASIC cell.

A digitally controlled oscillator (DCO) is used to perform the digital-to-frequency conversion (DFC). The DCO is a key component of the ADPLL-based frequency synthesizer that acts as a local oscillator for the transmitter and receiver. The DCO intentionally avoids any analog tuning controls. A block diagram illustrating the DCO and high-band and low-band dividers implemented as an ASIC cell is shown in FIG. 7. The 3.6 GHz oscillator core 122, low-band (LB) 124 and high-band (HB) 126 dividers are built as a single ASIC cell 120 with digital I/O's, even at the HB RF output frequency of 1.8 GHz since the rise and fall times are designed to be less than 50 ps. The single DCO is shared between the transmitter and receiver.

The four TX and four RX bands of the GSM specification are supported by this architecture with a single oscillator. The DCO core operates in the 3.2-4.0 GHz region with 100 MHz tuning margin. The high and low bands are obtained by dividing the DCO core frequency by two and four, respectively. The full 3.2-4.0 GHz range constitutes a relative extent of 22.2%. The individual TX and RX bands constitute narrower relative frequency ranges, the widest of which is the DCS-1800 TX band of 2.1%. The most stringent phase noise requirement of a GSM oscillator is derived based on the emission specification from the 880-915 MHz TX band into the original 935-960 MHz RX band. Hence, if TX SAW filters are to be avoided, the low-band oscillator phase noise at 20-80 MHz frequency offset should be <−162 dBc/Hz.

Figure 8:
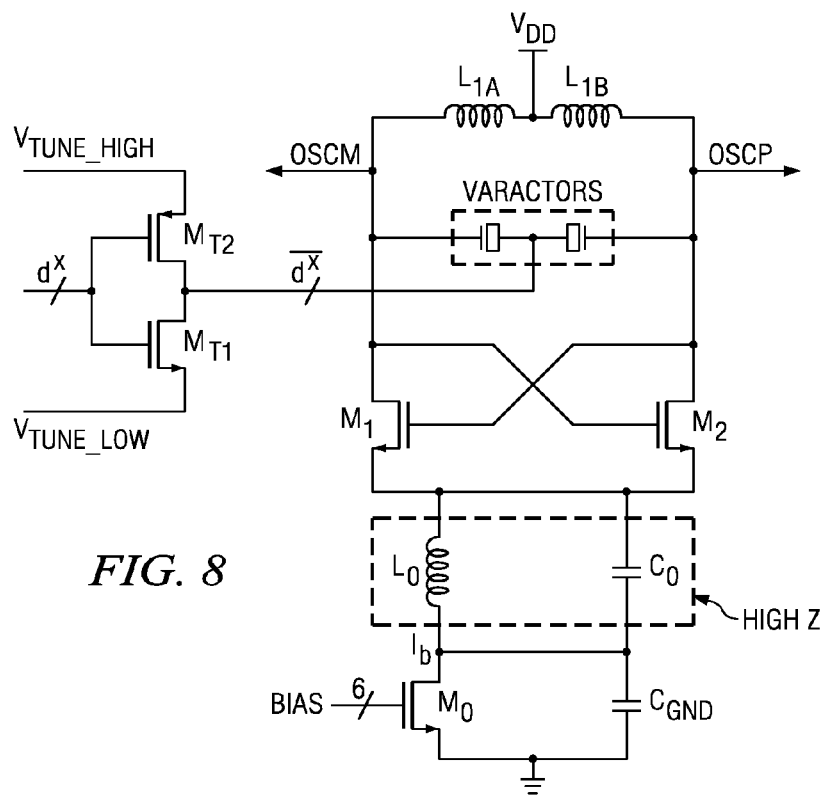
FIG. 8 is a schematic diagram illustrating oscillator core and the varactor state driver array.

A schematic diagram illustrating DCO oscillator core and the varactor state driver array is shown in FIG. 8. Note that nMOS is used for the cross-coupled pair, $M_1$ and $M_2$, because in this process it has a lower $1/f$ noise than that of pMOS. When $M_0$ is operated in the saturation region, it can contribute as much as 15% to the total phase noise, hence it was biased in the linear region. Although functionally $M_0$ may be eliminated, it is retained to reduce the phase noise sensitivity to supply noise. The second resonator operating at 2× of the main resonant frequency providing high-Z improves effective/loaded tank Q. Capacitor $C_{GND}$ is a 40 pF capacitor to bring the bottom node of the high-Z tank to an AC ground and to reduce up-conversion of high-frequency noise from the bias circuit. For phase noise performance reasons, the internal sinusoidal differential DCO output, oscp/m, directly drives the nMOS and pMOS gates of the dividers. This is acceptable, since the peak-to-peak single-ended voltage swing is greater than $V_{DD}$. All the varactors are realized as n-poly/n-well MOSCAP devices that operate in the flat regions of their C-V curves. The new varactors and the DCO core structure result in improved phase noise which is needed to meet the stricter GSM requirements.

TABLE 1

DCO varactor banks. Δf is at the high-band output.

| Varactor bank | Input | Weighting | Step size Δf |
|---|---|---|---|
| PVT | $d^P$ | 8-bit binary | $\Delta f^P = 4$ MHz |
| Acquisition | $d^A$ | 64-bit unit | $\Delta f^A = 200$ kHz |
| Tracking int. | $d^T$ | 64-bit unit | $\Delta f^T = 12$ kHz |
| Tracking fract. | $d^{TF}$ | 3-bit unit | $\Delta f^T = 12$ kHz |

With reference to FIG. 7, the four DCO input buses comprise the raw oscillator tuning word (OTW) that is analogous to the tuning voltage of a VCO. Their bits individually control capacitive states of the LC-tank varactors, thus establishing the LC-tank resonating frequency. The $d^P$ and $d^A$ inputs correspond to the process-voltage-temperature (PVT) and acquisition banks, respectively, and are activated sequentially during frequency locking and are frozen afterwards. The $d^T$ and $d^{TF}$ inputs comprise the integer tracking and fractional tracking bits, respectively, and are used during the actual RF transmission and reception. The integer tracking bus is unit-weighted and is clocked at the 26 MHz reference frequency of the phase comparison. The fractional tracking inputs serve to enhance the DCO frequency resolution through high-speed ΣΔ dithering. Table 1 above summarizes the varactor banks arrangement.

Digitally Controlled Power Amplifier

Figure 9A:
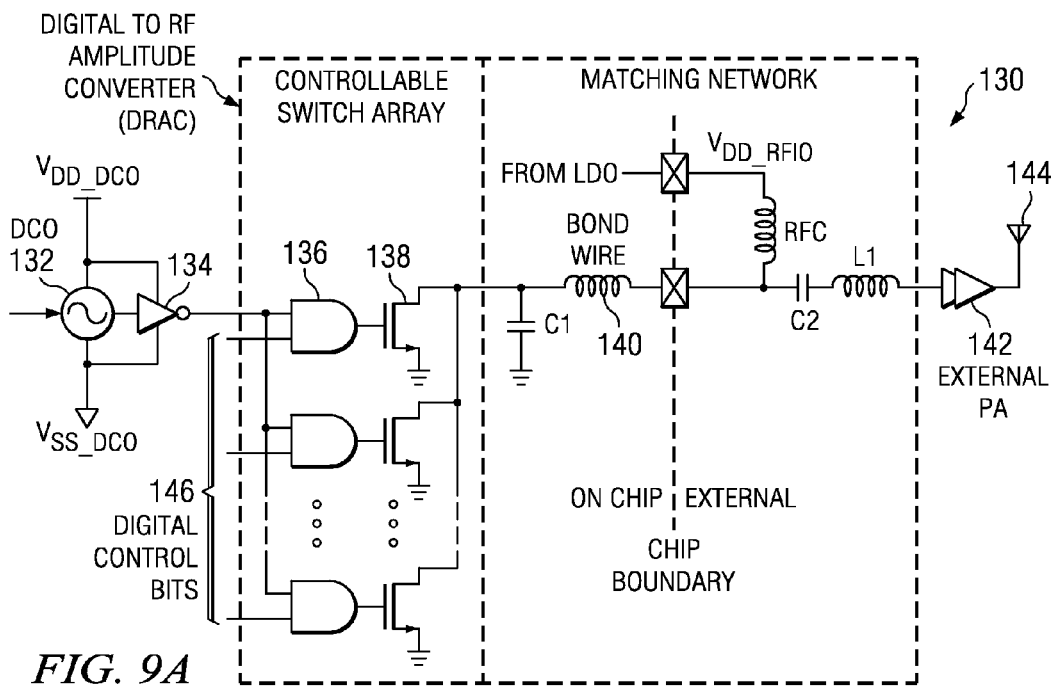
FIG. 9A is a block diagram illustrating the structure of the digitally-controlled power amplifier (DPA)

The DPA, which functions as a digital-to-RF-amplitude converter (DRAC), operates as a near-class E RF power amplifier and is driven by the square wave output of the DCO. The basic structure can be used to regulate RF power or perform amplitude modulation of a complex transmitter. A block diagram illustrating the structure of the digitally-controlled power amplifier (PA) is shown in FIG. 9A. The DRAC, generally referenced 130, comprises a plurality of N pass-gate type AND gates 136, a plurality of N output devices 138 (nMOS devices in this example), capacitors C1, C2 and inductors 140, L1, RFC. The DRAC operates as a pseudo class E type amplifier and is driven by a transmit chain signal comprising the square wave signal output of DCO 132 and buffer 134. Being a class E buffer, no DC bias current is required by the DRAC, unlike class A, class AB, class C or class D. The square wave signal is the phase-modulated signal from the all digital PLL (ADPLL) described supra. The N nMOS transistors are used as on/off switches. An RF choke (RFC) functions as a bi-directional current source, connecting the nMOS switches to the on-chip supply voltage regulator ($V_{DD\_RFIO}$). The switch array is driven by a digital signal. In this manner, the buffer generates an analog voltage waveform at its output.

Capacitor C1 represents the on-chip capacitor connected in parallel to the drain terminals of each nMOS switch and includes, for analysis purposes, the equivalent capacitance over one cycle given by the non-linear $C_{DD}$ of the nMOS switch. The residual second harmonic of the transmit frequency is filtered by the series combination of C2 and L1, allowing the DRAC itself to remain a single-ended circuit. The remaining matching network components are selected to achieve the condition where the switch output is critically damped, such that the drain voltage is low when the output current is high and vice versa.

Furthermore, in order to preserve the gate oxide integrity of the switches 138, the voltage swing at the drain must be controlled by the matching network to satisfy $V_{eff,GOI} < 2 \cdot V_{DD}$, where $V_{eff,GOI}$ represents the equivalent DC voltage on the drain resulting from one RF cycle. This buffer circuit is ideally suited to a low voltage environment in a digital CMOS process because, unlike in class A, B and C amplifiers where the transistor acts as a current source, there is no headroom requirement on $V_{DS}$ with this structure. The only requirement is that $V_{GS}$ must be able to go higher than the threshold voltage for the transistor to turn on, which is naturally guaranteed by the input digital signal. Another advantage of this buffer circuit, implemented in a deep submicron CMOS process, is that the extra input circuitry and output filtering circuitry of class F type amplifiers is not required.

The control logic for each nMOS switch comprises a pass-gate type AND gate whose inputs are the phase modulated output of the ADPLL and the amplitude control word (ACW) from a digital control block. It is the on-resistance and driving strength of the switch that is exploited in the DRAC concept to introduce power control of the transmitted waveform and allows the fully-digital method of controlling the output power. The AND gate is implemented as a pass-gate rather than a conventional standard fully static AND gate. This has the advantage of minimizing thermal noise from the AND function which in turn reduces the ultimate broadband phase noise floor of the DRAC. As described supra, alternative implementations of the AND gate function include using a cascode (or current steering topology) or degenerative device together with the driver transistor. These approaches, however, suffer from degraded output noise performance and increased local oscillator (LO) feed through (via device parasitic capacitance) which limits the dynamic range of the DRAC, and are thus not preferred.

In the example implementation, the RF output signal generated by the DRAC circuit is subsequently input to an external power amplifier 142 where the signal is amplified to the appropriate levels in accordance with the particular wireless standard. The output of the power amplifier is input to the antenna 144 for broadcast transmission over the air. The DRAC can also be implemented with a high output-power level.

In deep submicron CMOS technology, the ratio between the maximum output power that can be provided from a supply of 1.4 V to the minimum output power of a single transistor dictates the maximum number of transistors that can be implemented in the DPA. In this example embodiment, 64 parallel-connected transistors resulting in 6-bits of basic amplitude resolution were selected to simplify the layout.

Figure 10:
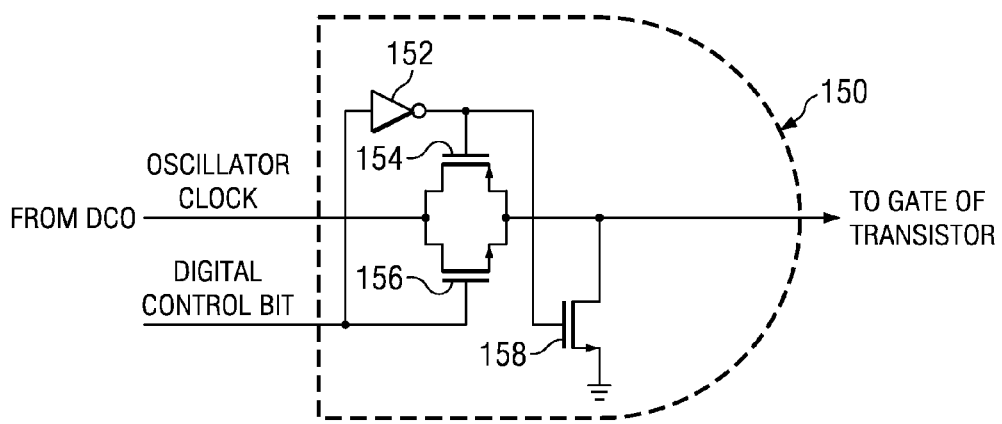
FIG. 10 is a circuit diagram illustrating the structure of the AND gate of the DPA in more detail.

A circuit diagram illustrating the pass-gate AND function of the DPA in more detail is shown in FIG. 10. The pass-gate type AND function circuit, generally referenced 150, comprises a pMOS transistor 154, nMOS transistor 156, isolation transistor 158 and inverter 152. In operation, the pass-gate permits very efficient implementation of simple gates and requires few transistors, with a small delay due to the single inversion level. Its advantage is that the gate structure effectively filters out digital control noise and provides high isolation between the A input and the output and between A and B inputs. The low noise is due to the fact that the output current does not pass through the pass-gate, thus the pass-gate contributes virtually zero noise. To achieve additional isolation, the output of the pass-gate is pulled to ground through isolation transistor 158 to ensure the switch is turned off and to further reduce the signal coupling between the A input and the output.

Figure 9B:
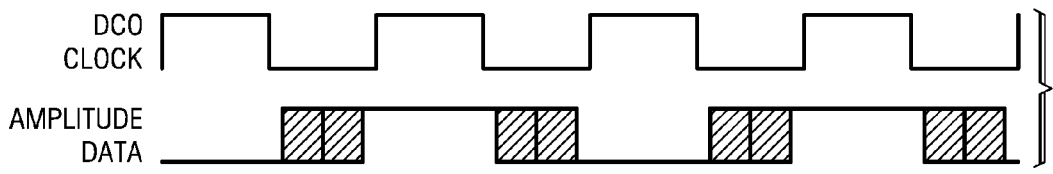
FIG. 9B is a timing diagram illustrating the preferred timing of the amplitude data relative to the DCO clock.

Note that it is critical that the DCO clock edge and the data edge inputs to the AND gates be aligned. This is not a trivial task since power for the two paths are generated by different power supplies and undergo different clock tree delays. The ideal timing for the data change is somewhere in the middle of the DCO clock low state as shown in FIG. 9B.

All-Digital PLL

The frequency synthesizer of the present invention is an all-digital PLL (ADPLL) with all building blocks defined as digital at the input/output level. It uses digital design and circuit techniques from the ground up. A key component is a digitally-controlled oscillator (DCO) 178, which deliberately avoids any analog tuning voltage controls. This permits the loop control circuitry to be implemented in a fully digital manner. The DCO is analogous to a flip-flop, i.e. the cornerstone of digital circuits, whose internals are analog, but the analog nature does not propagate beyond its boundaries.

Figure 11:
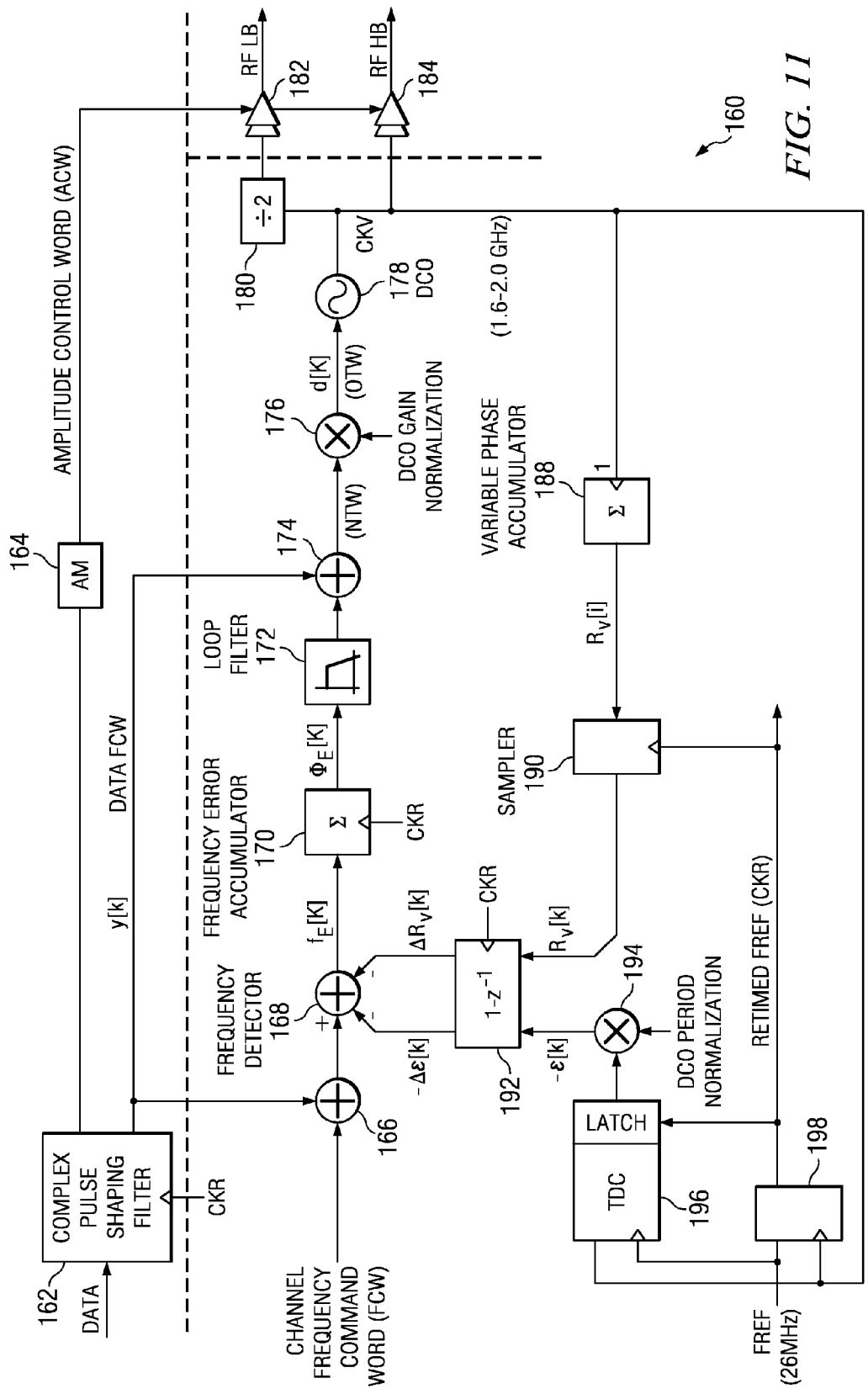
FIG. 11 is a block diagram illustrating the polar transmitter of the present invention constructed based on an all-digital phase lock loop (PLL)

A block diagram illustrating the polar transmitter of the present invention constructed based on an all-digital phase lock loop (PLL) is shown in FIG. 11. The polar RF transmitter, generally referenced 160, is based on an all-digital PLL frequency synthesizer with a digital direct frequency modulation capability. The expected variable frequency ($f_V$) is related to the reference frequency ($f_R$) by the frequency command word (FCW).

$$FCW[k] \equiv \frac{E(f_V[k])}{f_R} \quad (3)$$

The FCW is time variant and is allowed to change with every cycle $T_R = 1/f_R$ of the frequency reference clock. With the fractional portion of the word length of FCW $W_F = 24$, the ADPLL provides fine frequency control with 1.5 Hz accuracy, in accordance with:

$$\Delta f_{res} = \frac{f_R}{2^{W_F}} \quad (4)$$

The number of integer bits $W_I = 8$ is selected to fully cover the GSM band frequency range of $f_V = 1600\text{-}2000$ MHz with an arbitrary reference frequency $f_R \geq 8$ MHz.

The ADPLL sequencer traverses through the PVT calibration and acquisition modes during channel selection and frequency locking and stays in the tracking mode during the transmission or reception of a burst. To extend the DCO range to accommodate for voltage and temperature drifts, and to allow wide frequency modulation, the coarser-step acquisition bits are engaged by subtracting an equivalent number (generally fractional) of the tracking bank varactors. The acquisition/tracking varactor frequency step calibration is performed in the background with minimal overhead using dedicated hardware.

Phase-Domain Operation

The phase domain operation is motivated by an observation, that, since the reference phase and oscillator phase are in a linear form, their difference produced by the phase detector is also linear with no spurs and a loop filter is not needed. This is in contrast with conventional charge-pump-based PLLs, whose phase detection operation is correlational and generates significant amount of spurs that require a strong loop filter that degrades the transients and limits the switching time.

The ADPLL operates in a digitally-synchronous fixed-point phase domain as follows: The variable phase $R_V[i]$ is determined by counting the number of rising clock transitions of the DCO oscillator clock CKV.

$$R_V[i] = \sum_{l=0}^{i} 1 \quad (5)$$

The index i indicates the DCO edge activity. The FREF-sampled variable phase $R_V[k]$, where k is the index of the FREF edge activity, is fixed-point concatenated with the normalized time-to-digital converter (TDC) 196 output $\epsilon[k]$. The TDC measures and quantizes the time differences between the FREF and DCO edges. The sampled differentiated variable phase is subtracted from FCW by the digital frequency detector 168. The frequency error $f_E[k]$ samples $$f_E[k] = FCW - [(R_V[k] - \epsilon[k]) - (R_V[k-1]) - \epsilon[k-1])] \quad (6)$$

are accumulated to create the phase error $\phi_E[k]$ samples $$\phi_E[k] = \sum_{l=0}^{k} f_E[k] \quad (7)$$

which are then filtered by a fourth-order IIR loop filter 172 and scaled by a proportional loop attenuator $\alpha$. A parallel feed with coefficient $\rho$ adds an integrated term to create type-II loop characteristics, which suppresses the DCO flicker noise.

The IIR filter 172 is a cascade of four single stage filters, each satisfying the following equation:

$$y[k]=(1-\lambda)\cdot y[k-1]+\lambda\cdot x[k] \tag{8}$$

where x[k] is the current input, y[k] is the current output, and k is the configurable coefficient. The 4-pole IIR filter attenuates the reference and TDC quantization noise at the 80 dB/dec slope, primarily to meet the GSM spectral mask requirements at 400 kHz offset. The filtered and scaled phase error samples are then multiplied 176 by the DCO gain $K_{DCO}$ normalization factor $f_R/K_{DCO}$, where $f_R$ is the reference frequency and $K_{DCO}$ is the DCO gain estimate, to make the loop characteristics and modulation independent from $K_{DCO}$. The modulating data is injected into two points of the ADPLL for direct frequency modulation. A hitless gear-shifting mechanism for the dynamic loop bandwidth control serves to reduce the settling time. It changes the loop attenuator a several times during the frequency locking while adding the $(\alpha_1/\alpha_2-1)\phi_1$ DC offset to the phase error, where indices 1 and 2 stand for before and after the event, respectively. Note that $\phi_1=\phi_2$ since the phase is to be continuous.

The FREF input is resampled 198 by the RF oscillator clock, and the resulting retimed clock (CKR) is used throughout the system. This ensures that the massive digital logic is clocked after the quiet interval of the phase error detection by the TDC.

Direct Frequency Modulation

The frequency modulation uses a hybrid of a predictive/closed-loop modulation method. The fixed-point FCW modulating data y[k], with the sampling rate of $f_R$, directly affects the oscillating frequency. The PLL loop will try to correct this perceived frequency perturbation integrated over the update period of $1/f_R$. This corrective action is compensated by the other (i.e. compensating) y[k] feed that is added to the channel FCW. The loop response to y[k] is wideband and y[k] directly modulates the DCO frequency in a feed-forward manner such that it effectively removes the loop dynamics from the modulating transmit path. However, the remainder of the loop, including all error sources, operates under the normal closed-loop regime.

DCO Gain Normalization

Figure 12:
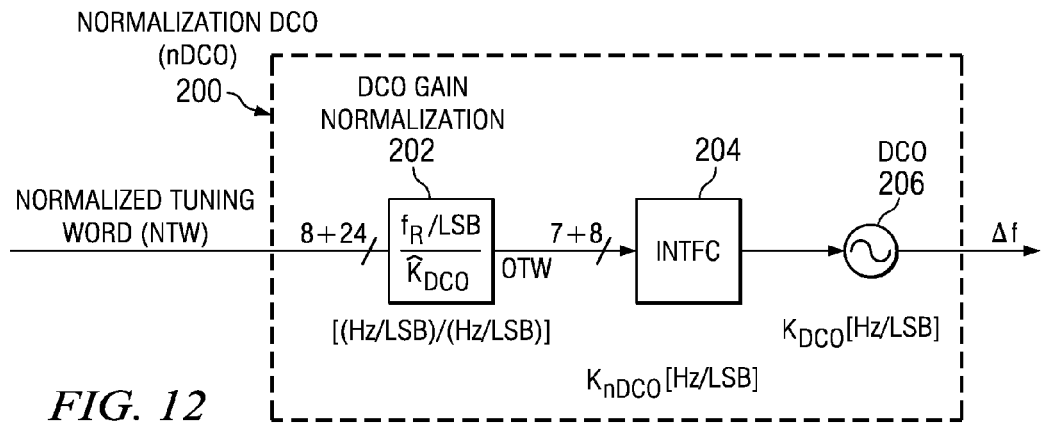
FIG. 12 is a block diagram illustrating the hardware abstraction layer of the normalized DCO of the present invention.

At a higher level of abstraction, the DCO oscillator, together with the DCO gain normalization $f_R/K_{DCO}$ multiplier, logically comprise the normalized DCO (nDCO), illustrated in FIG. 12. The DCO gain normalization conveniently decouples the phase and frequency information throughout the system from the process, voltage and temperature variations that normally affect the $K_{DCO}$. The frequency information is normalized to the value of the external reference frequency $f_R$. The digital input to the nDCO is a fixed-point normalized tuning word (NTW), whose integer part LSB bit corresponds to $f_R$. The reference frequency is chosen as the normalization factor because it is the master basis for the frequency synthesis. In addition, the clock rate and update operation of this discrete-time system are established by the reference frequency.

The quantity $K_{DCO}$ should be contrasted with the process-temperature-voltage-independent oscillator gain $K_{nDCO}$ which is defined as the frequency deviation (in Hz units) of the DCO in response to the 1 LSB change of the integer part of the NTW input. If the DCO gain estimate is exact, then $K_{nDCO}=f_R/LSB$, otherwise $$K_{nDCO} = f_R/LSB \cdot \frac{K_{DCO}}{\hat{K}_{DCO}} = f_R/LSB \cdot r \tag{9}$$

where dimensionless ratio $$r = \frac{K_{DCO}}{\hat{K}_{DCO}}$$

is a measure of the DCO gain estimation accuracy.

Time-to-Digital Converter

Figure 13A:
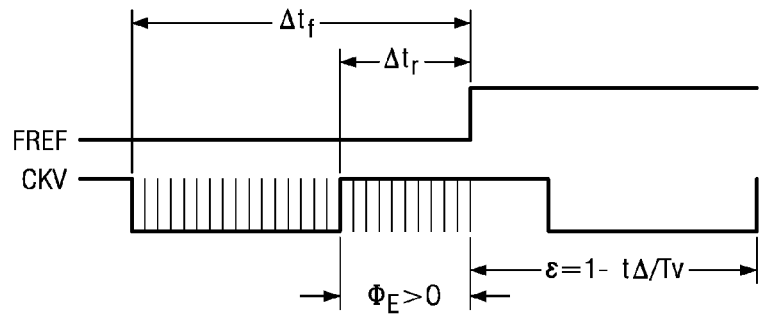
FIGS. 13A and 13B illustrate the fractional phase error estimation based on a time to digital converter (TDC)
Figure 13B:
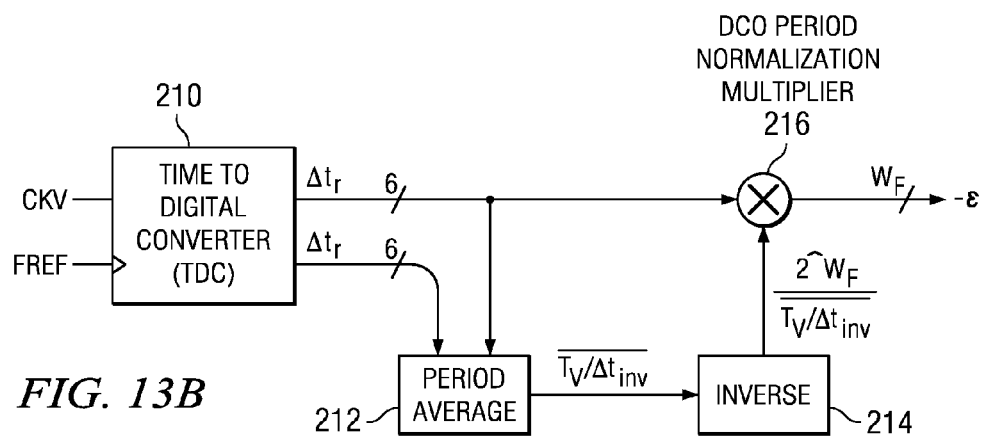

The fractional phase error estimation based on a time to digital converter (TDC) is shown in FIGS. 13A and 13B. Due to the DCO edge counting nature, the phase quantization resolution described above is limited to ±½ of the variable or DCO clock cycle, $T_V$. For wireless applications, a finer phase resolution is required, which may be achieved without forsaking the digitally-intensive approach. The whole-clock-domain quantization error $\epsilon$ is corrected by means of a fractional error correction circuit which is based on a time-to-digital converter (TDC) 210. The TDC measures the fractional delay difference between the reference clock and the next rising edge of the DCO clock.

Its resolution is a single inverter delay, $\Delta t_{inv}$, which in this deep-submicron CMOS process is considered the most stable logic-level regenerative delay and is shorter than 20 ps. This allows the implementation of a GSM-quality phase detection mechanism.

TDC Resolution Effect on Phase Noise

The TDC quantization of timing estimation $\Delta t_{inv}$ affects the in-band RF output phase noise of the ADPLL of FIG. 11 in accordance with:

$$L = \frac{(2\pi)^2}{12}\left(\frac{\Delta t_{inv}}{T_V}\right)^2 \cdot \frac{1}{f_R} \tag{10}$$

where $T_V$ is the DCO clock period and $f_R$ is the reference or sampling frequency. Substituting $\Delta t_{inv}=20$ ps, $f_R=26$ MHz, $f_0=1.8$ GHz, $T_V=556$ ps, we obtain L=−97.8 dBc/Hz. Equation 10 was validated experimentally within 1 dB of measurement error for $\Delta t_{inv}$ spanning 16-34 ps through varying the TDC supply voltage. The in-band phase noise performance provides ample margin for the GSM operation: 0.5° of the modulated rms phase noise was measured versus the specification of 5°. Future generations of deep-submicron CMOS processes can only bring reductions in $\Delta t_{inv}$, thus further improving the phase noise performance.

Frequency Response of Type-II Sixth-Order PLL

Figure 14:
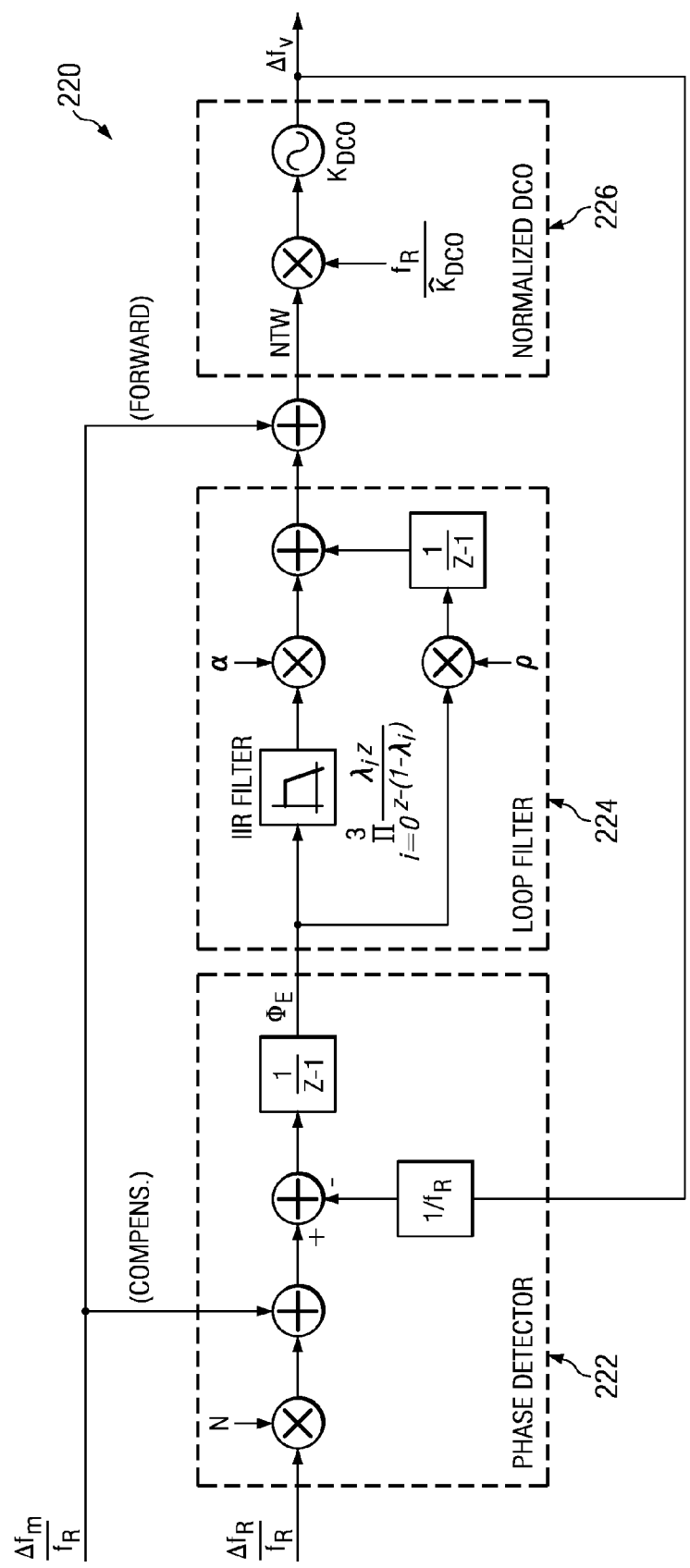
FIG. 14 is a block diagram illustrating the z-domain model of the ADPLL with wideband frequency modulation.

The ADPLL is a discrete-time sampled system implemented with all digital components connected with all digital signals. Consequently, the z-domain representation is not only the most natural fit but it is also the most accurate without the necessity for approximations that would result, for example, with an impulse response transformation due to the use of analog loop filter components. A block diagram illustrating the z-domain model of the ADPLL with wideband frequency modulation is shown in FIG. 14.

The ADPLL implemented in this embodiment uses four independently controlled IIR stages. Equation 11 below is a linearized s-domain (based on $z \approx 1+s/f_R$ conversion formula) open-loop model that includes the four cascaded single-stage IIR filters, each with an attenuation factor $\lambda_i$, where $i=0 \ldots 3$.

$$H_{ol}(s) = \frac{\rho \cdot f_R^2}{s} \cdot \frac{1 + \frac{2}{\rho \cdot f_R/\alpha}}{s} \cdot \prod_{i=0}^{3} \frac{1 + \frac{s}{f_R}}{1 + \frac{s}{\lambda_i \cdot f_R}} \quad (11)$$

The type-II sixth-order loop shows two poles at origin $\omega_{p1}=\omega_{p2}=0$, four poles at $\omega_{p,3+i}=j\lambda_i f_R$, for $i=0 \ldots 3$, one zero at $$\omega_{z1} = j \cdot \frac{\rho f_R}{\alpha},$$

and four zeros at $\omega_{z,2+i}=jf_R$, for $i=0 \ldots 3$.

Since the TDC-based phase detection mechanism of the transmitter of the present invention measures the oscillator timing excursion normalized to the DCO clock cycle, the frequency multiplier N≡FCW is not part of the open-loop transfer function and, hence, does not affect the loop bandwidth. This is in contrast to conventional PLLs that use frequency division in the feedback path. Phase deviation of the frequency reference, on the other hand, needs to be multiplied by N since it is measured by the same phase detection mechanism normalized to the DCO clock cycle. The same amount of timing excursion on the FREF input translates into a larger phase by a factor of N when viewed by the phase detector.

The closed loop transfer function for the reference is low-pass with the gain multiplier N≡FCW $$H_{cl}(s) = N \cdot \frac{H_{ol}(s)}{1 + H_{ol}(s)} \quad (12)$$

The closed loop transfer function for the TDC is low-pass $$H_{cl,T}(s) = \frac{H_{ol}(s)}{1 + H_{ol}(s)} \quad (13)$$

The closed loop transfer function for the DCO is high-pass $$H_{cl,V}(s) = \frac{1}{1 + H_{ol}(s)} \quad (14)$$

Figure 15A:
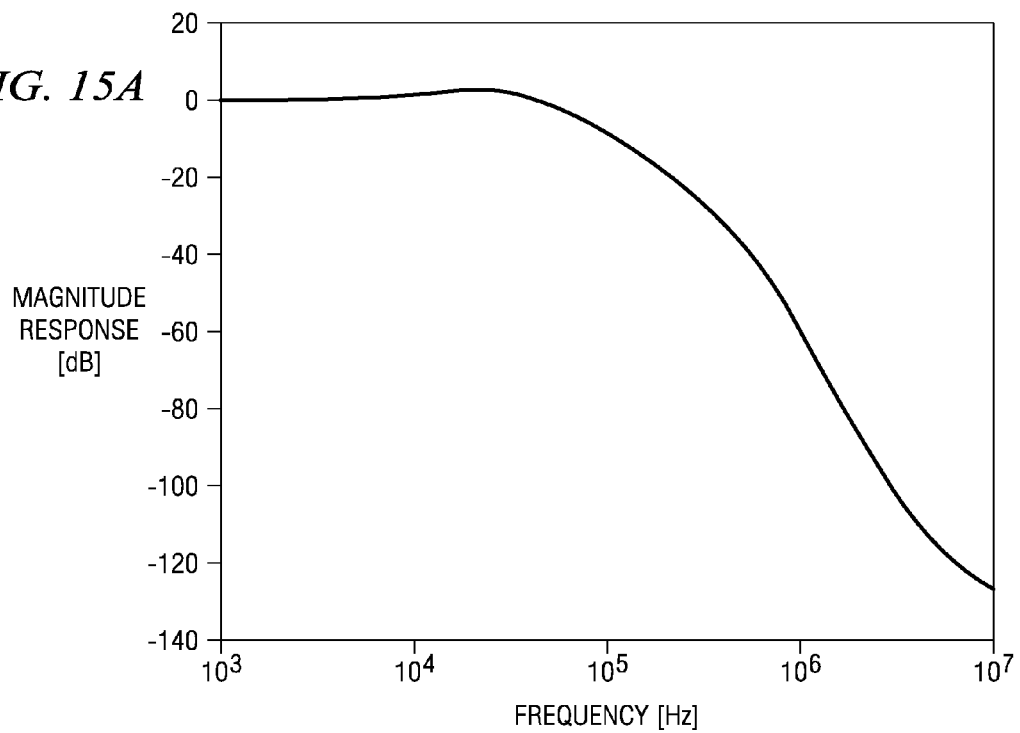
FIG. 15A is a graph illustrating the ADPLL closed loop transfer function for the reference phase.
Figure 15B:
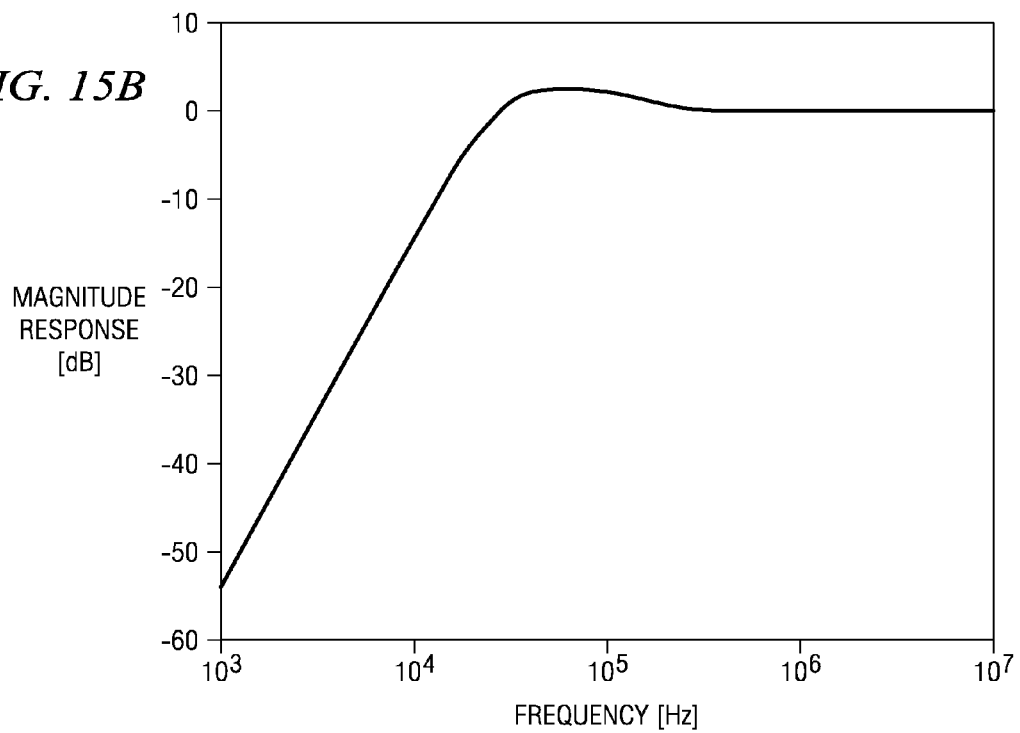
FIG. 15B is a graph illustrating the ADPLL closed loop transfer function for the variable phase from the output of the DCO.

The following loop filter settings: $\alpha=2^{-7}$, $\rho=2^{-15}$ and $\lambda=[2^{-3},2^{-3},2^{-3},2^{-4}]$ establish the closed-loop bandwidth of 40 kHz and provide 33 dB of attenuation of the FREF phase noise and TDC quantization noise. The type-II setting provides 40 dB/dec filtering of the DCO 1/f noise. Graphs illustrating the ADPLL closed loop transfer function for the reference and variable feeds are shown in FIGS. 15A, 15B, respectively.

Amplitude Modulation

Figure 16:
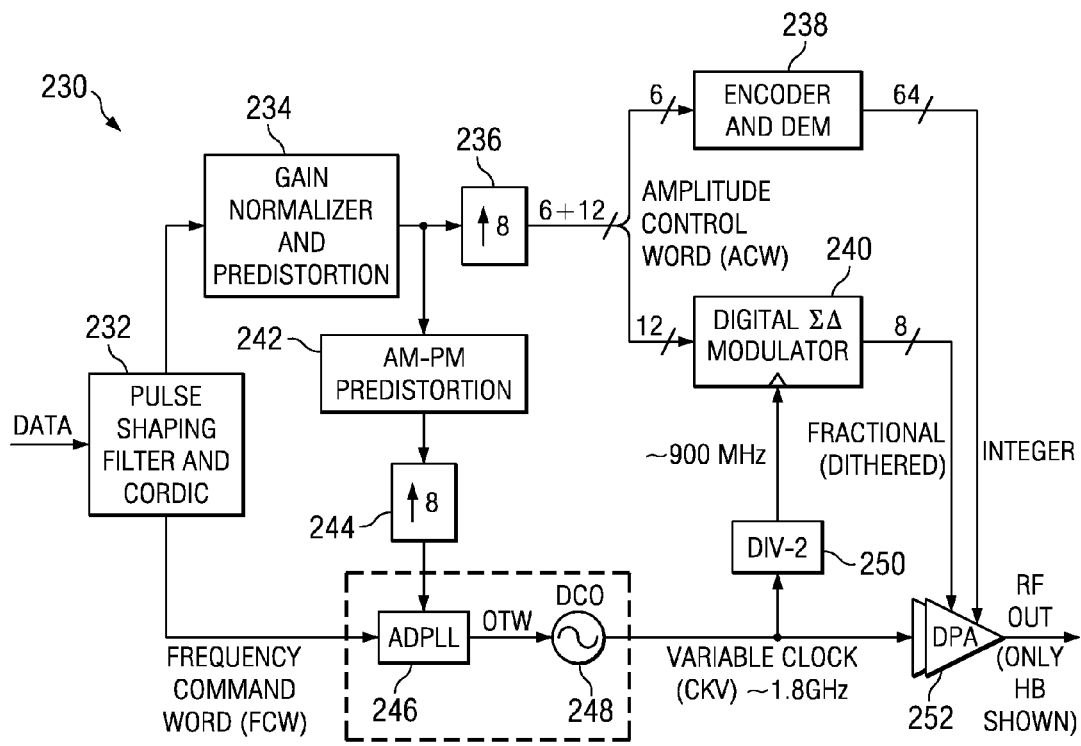
FIG. 16 is a block diagram illustrating the amplitude modulation path of the polar transmitter of the present invention.

A block diagram illustrating the amplitude modulation path of the polar transmitter of the present invention is shown in FIG. 16. The modulator, generally referenced 230, comprises a pulse shaping filter and CORDIC 232, gain normalizer and predistortion block 234, amplitude modulation/phase modulation (AM-PM) pre-distortion block 242, upsampling by eight 236, 244, all digital phase locked loop (ADPLL) 246 with DCO 248, encoder and dynamic element matching (DEM) block 238, digital ΣΔ modulator 240, divide by two 250 and digitally controlled amplifier (DPA) 252.

The pulse-shaping filter 232 comprises separate I and Q filters followed by a CORDIC algorithm to convert to polar-domain phase and amplitude outputs. The sampling rate is 3.25 MHz and is interpolated up to 26 MHz to further smoothen the modulating signals. The phase is differentiated to fit the FCW frequency format of the ADPLL input. The amplitude output is multiplied by the step size of the digitally-controlled power amplifier (DPA) and is then AM-AM predistorted. The amplitude control word (ACW) is then converted to the 64-bit unit-weighted format of the DPA. A dedicated bank of 8 DPA transistors undergoes a 900 MHz third-order ΣΔ modulation to enhance the amplitude resolution and to achieve noise spectral shaping. As in the DCO controller, the DPA controller also performs dynamic element matching (DEM) to enhance the time-averaged linearity. In the case of GSM mode, a single Gaussian pulse shaping filter is used and the CORDIC circuit is bypassed. The AM path is temporarily engaged to ramp the output power to a desired level to remain fixed throughout the payload.

Pre-Power Amplifier Encoding

Figure 17:
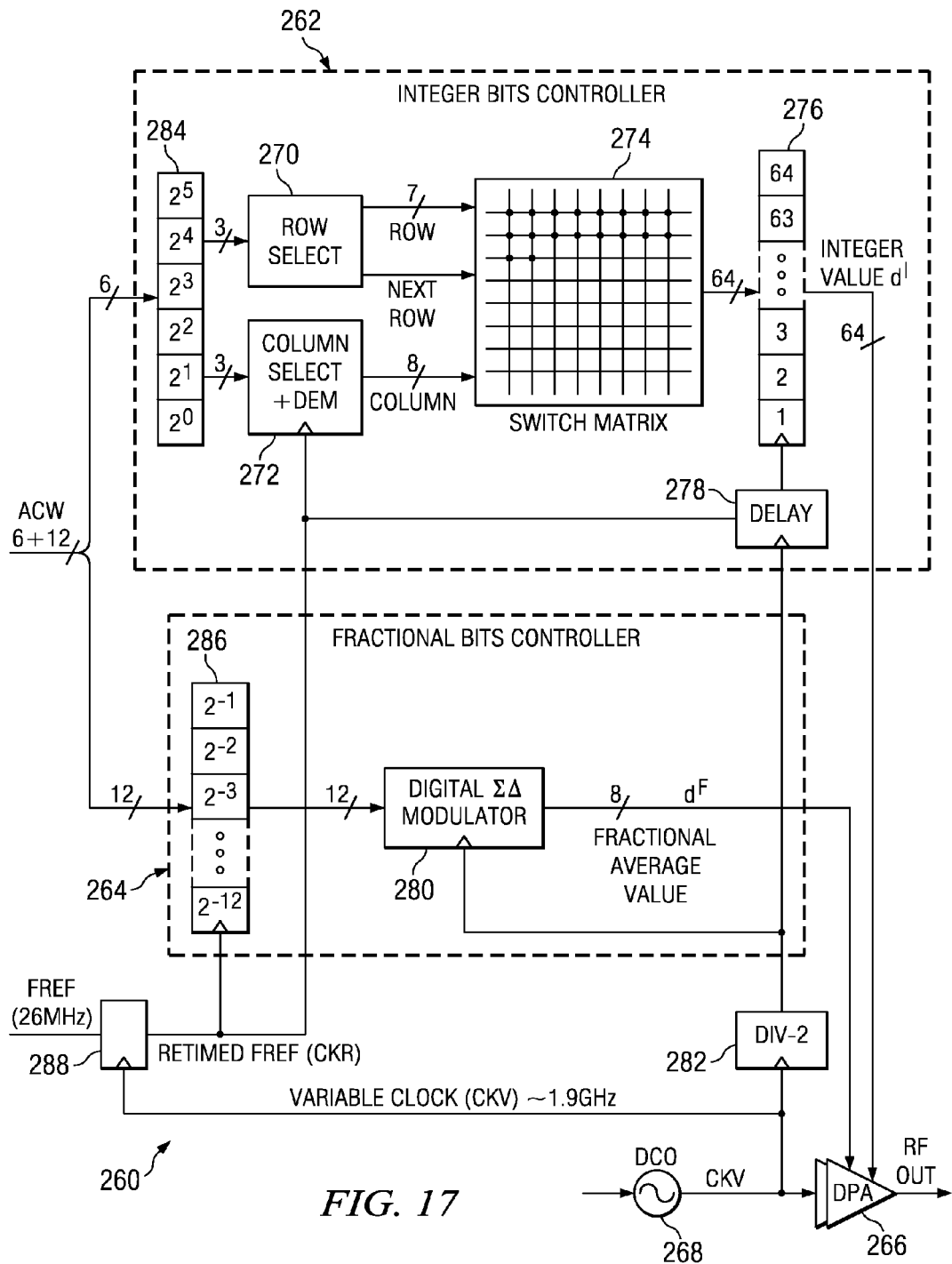
FIG. 17 is a block diagram illustrating the encoding scheme of the pre-power amplifier (PPA) and the enhancement of the resolution of the PPA using ΣΔ dithering.

A block diagram illustrating the encoding scheme of the pre-power amplifier (PPA) and the enhancement of the resolution of the PPA using ΣΔ dithering is shown in FIG. 17. Note that the DCO modulator has the same structure, but the bit allocation and clock rates are different.

The circuit, generally referenced 260, comprises an integer bits controller 262 and fractional bits controller 264. The DCO directly provides the frequency/phase-modulated carrier to the DPA input. The DPA circuit is constructed as an array of carefully laid-out 64 unit-weighted transistor switches in switch matrix 274 that are used to provide coarse 6-bit digital amplitude modulation. The integer bits controller comprises register bank 284, row select 270, column select 272, switch matrix 274 and output register 262. The integer word is encoded from binary to unit weighted thermometer code and the device undergoes dynamic element matching (DEM) to improve long-term linearity. An additional 12-bits of fine amplitude modulation are also provided with a separate bank of 8 unit-weighted transistors. The DPA interface logic, especially the 900 MHz ΣΔ dithering circuit for the 8 unit-weighted transistors, is located nearby.

The digital ΣΔ modulator for the DCO is implemented as a second-order MASH-type architecture. The ΣΔ stream equation is presented below.

$$d = c_1 \cdot z^{-1} + c_2 \cdot (1-z^{-1}) \quad (15)$$

The final addition is done through unit element summation.

Figure 18:
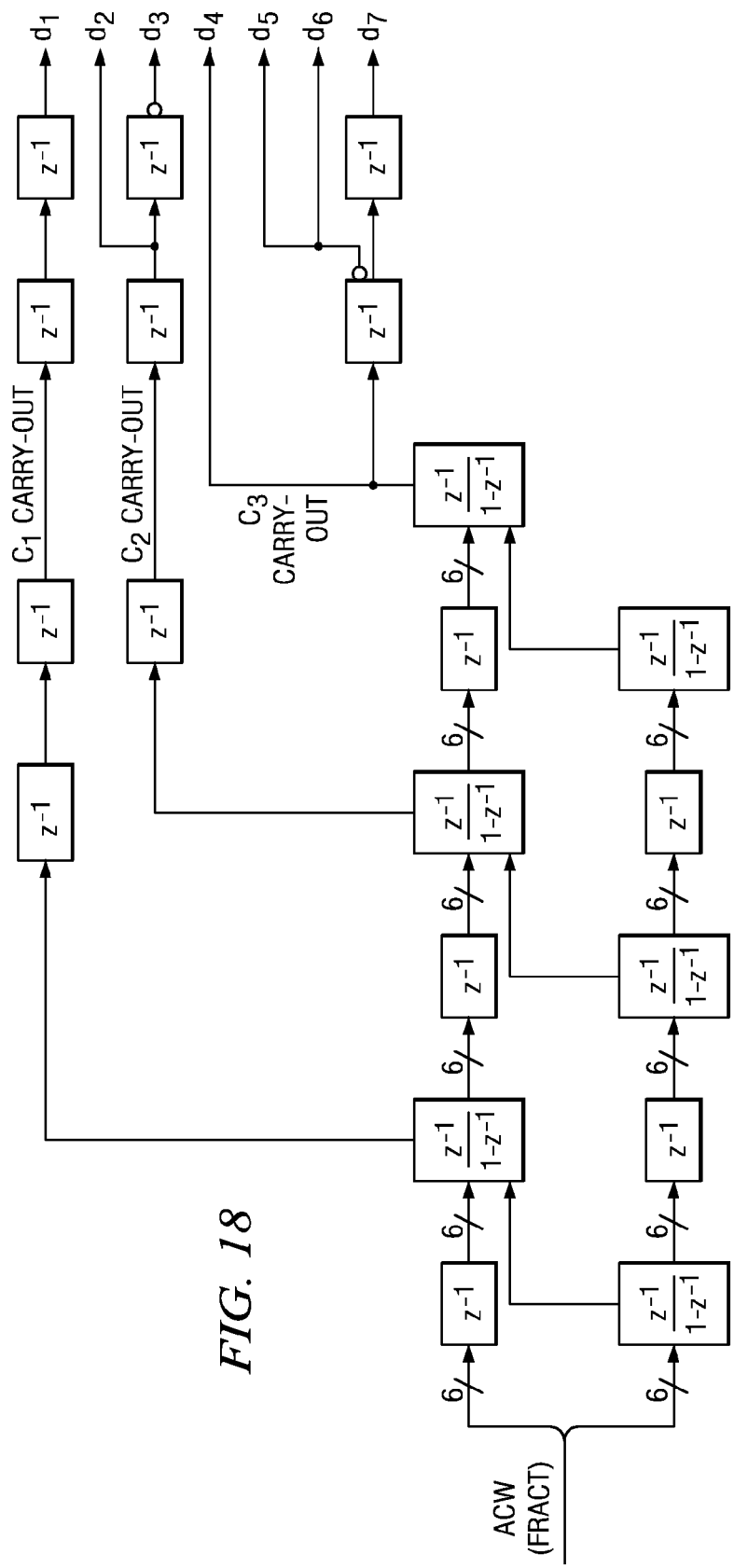
FIG. 18 is a block diagram illustrating the third-order pipelined MASH-type ΣΔ modulator.

The ΣΔ modulator for the DPA is implemented as a third-order pipelined MASH-type structure as shown in FIG. 18. The $$\frac{z^{-1}}{1-z^{-1}}$$

blocks denote accumulators with registered sum and carry outputs. An advantage of this structure is that it is modular enabling it to be partitioned into smaller accumulator blocks with smaller number of bits making it synthesizable at very high frequency, i.e. 1 GHz. The structure is built as a matrix. Increasing the number of accumulators in the row increases the order of $\Sigma\Delta$, while increasing the number of accumulators in the column increases the resolution of $\Sigma\Delta$. In this example implementation, the 12 fractional bits are split into six lower-order and six higher-order bits and the two paths are processed separately in each stage. The recombination of the lower-order carry out bits is executed every stage. Proper delays between the paths ensures correct processing.

To transmit an EDGE signal that passes the specification mask with the required power control a much higher resolution is required than what is provided by the 64 DPA transistors. Therefore, over and above the 6-bits of Nyquist resolution provided by the 64 transistors, an additional eight bits are added that will receive high speed $\Sigma\Delta$ outputs representing the fractional portion of the amplitude. The fractional input resolution to the $\Sigma\Delta$ is 12-bits. This enables the DPA to support a resolution up to 18-bits, i.e. 6-bits integer running at a slow sampling frequency, 26 MHz, and 12-bits fractional running at high sampling frequency, i.e., 900 MHz.

The carry-out streams form the following third-order $\Sigma\Delta$ equation:

$$d = c_1 \cdot z^{-2} + c_2 \cdot (z^{-1} - z^{-2}) + c_3 \cdot (1 - 2z^{-1} + z^{-2}) \qquad (16)$$

Hybrid Polar/Cartesian TX Architecture

Figure 19:
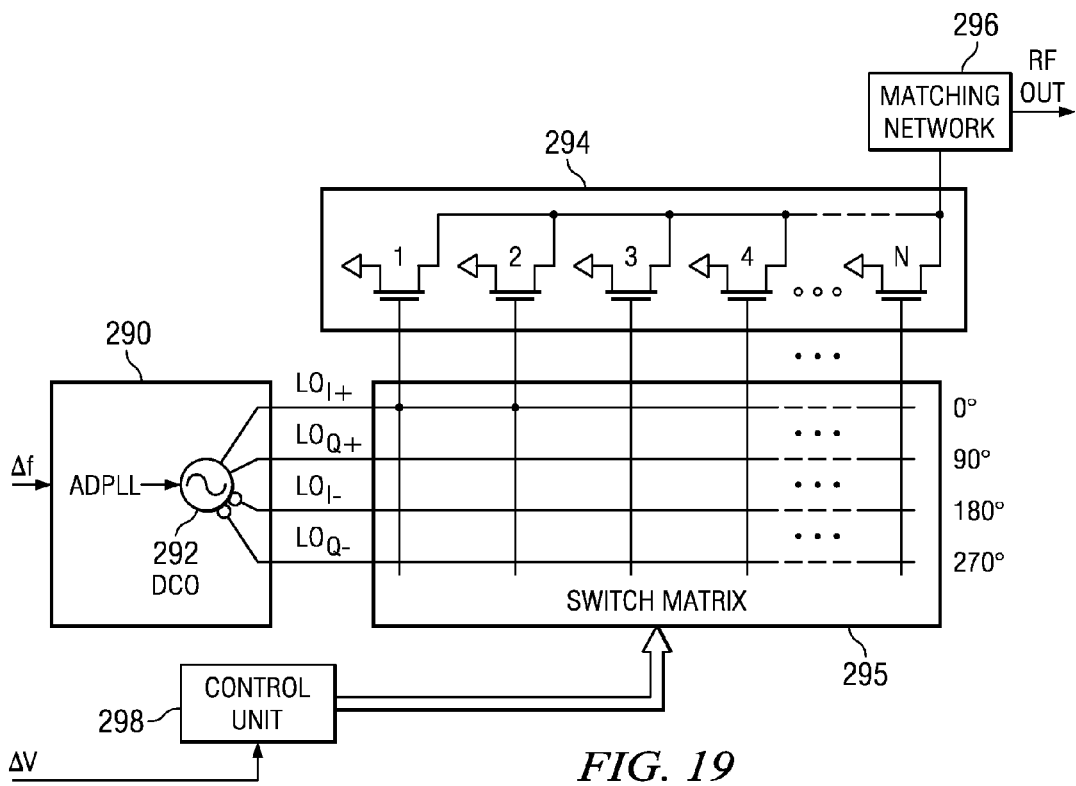
FIG. 19 is a block diagram illustrating the digital I/Q modulator incorporating a switch matrix, control unit and transistor array.

A block diagram illustrating the digital I/Q modulator incorporating a switch matrix, control unit and transistor array is shown in FIG. 19. The modulator comprises an ADPLL 290 with DCO 292, control unit (CU) 298, switch matrix 295, transistor array 294 and matching network 296. The DCO provides quadrature output at the RF frequency. The DCO core runs at 2× frequency and quadrature dividers produce 90 degree spaced phases. Low phase noise requirements of the TX call for a CMOS-type divider (e.g., dynamic) rather than an ECL-type. The DPA consists of the nMOS transistor array 294, switch matrix 295 and digital control unit 298. It is followed by a matching network 296. The transistor array is viewed as an array of current sources (or perhaps resistors) switched on/off at the RF rate, if enabled. Each transistor contributes current (or conductance) at a certain phase assigned by the switch matrix. Note that the transistors are not associated with any particular phase. The current (or conductance) contribution of each transistor is non-linear, particularly with the larger total number of the active transistors.

Note that although the invention is described in the context of generating the RF output signal by summing the currents generated by a plurality of transistors, it is not to be limited to this. Alternatively, each transistor can contribute a conductance (or resistance) and the RF output is substantially proportional to the sum of the conductances rather than currents. Depending on the region of operation of the switching devices, it could be the on resistance of each active switch that contributes to the controlled amplitude of the output RF waveform. It is also likely that the switching devices undergo change of the dominant operating region in each switching cycle thus resulting in a mixture of the of the current-mode and conductance mode regimes. It is noted that summing currents is not equivalent to summing conductances since each transistor can be replaced by an independent current source whereby the current from each source is added but not their conductances.

Figure 20A:
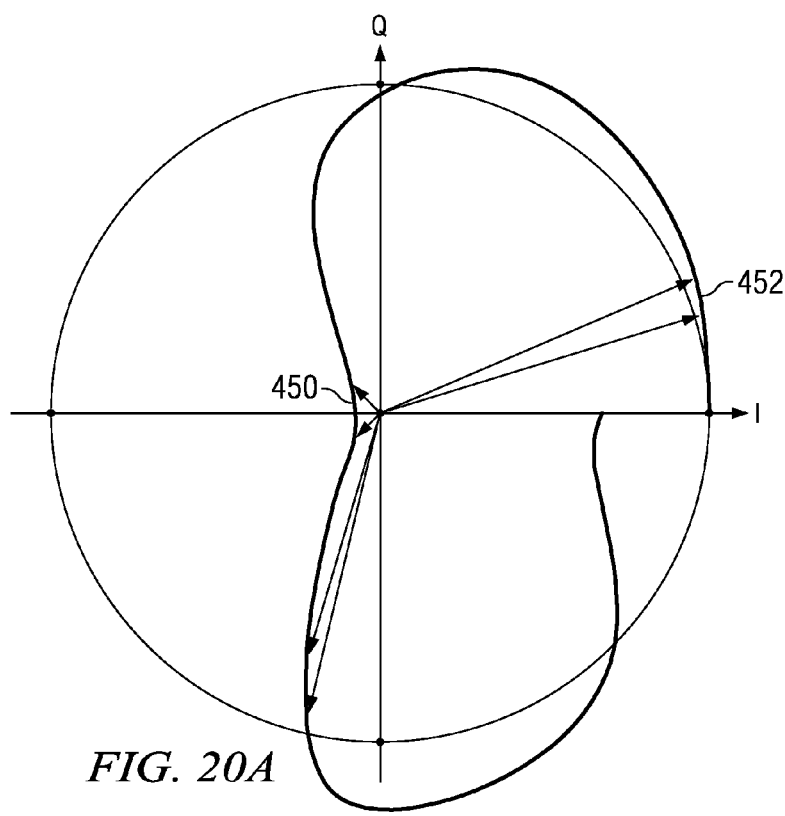
FIGS. 20A and 20B are diagrams illustrating the I/Q domain operation of the present invention.

The I/Q domain operation of the present invention is illustrated in FIG. 20A. The frequency control of the DCO for polar modulation is extremely precise but with a practically limited range of perhaps 10 MHz. This is disadvantageous when, during the complex modulation, the I/Q vector is close to the origin (i.e. small amplitude) and makes quick large phase/frequency changes, such as indicated by reference numeral 450, versus small phase/frequency changes indicated by reference numeral 452. The frequency deviation $\Delta f$ requirements for WCDMA, for example, are relatively high. Unlike with EDGE, where the data rate is approximately 270 ksymbols/sec, the data rate and bandwidth in WCDMA are an order of magnitude higher. The polar architecture described supra is suitable for EDGE transmission but cannot be readily used for certain modulation schemes such as those used in WCDMA and WLAN transmission because the modulation data rate is very high in these schemes with the resultant difficulty of performing high frequency modulation of the DCO and the amplitude. Compared to phase modulation, amplitude modulation is quite coarse. In the phase/frequency modulator, the transistors used in the varactors have a much finer contribution and the frequency change relative to the carrier is very small.

Figure 3A:
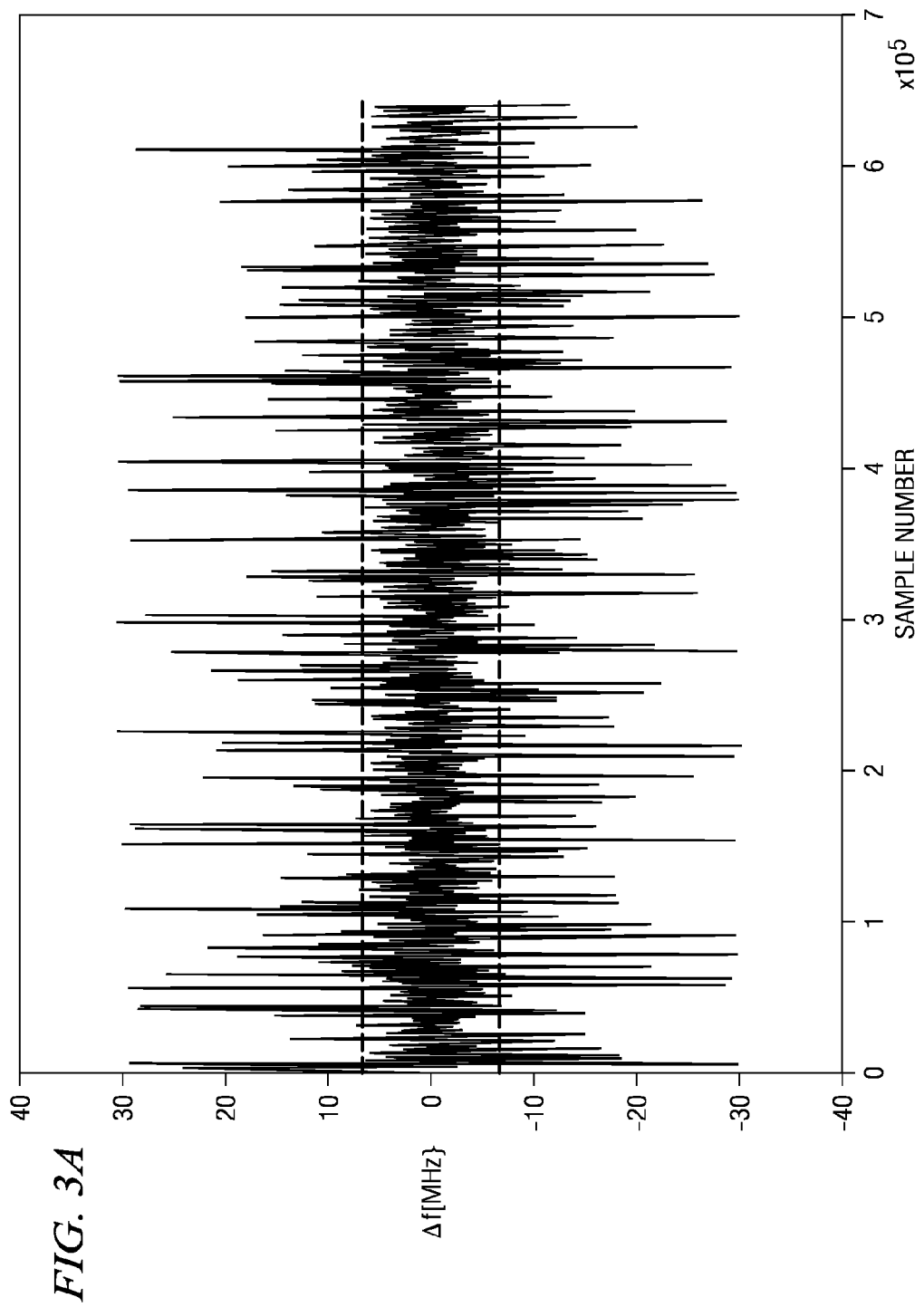
FIG. 3A is a plot of Δf versus time in an example WCDMA based system.
Figure 3B:
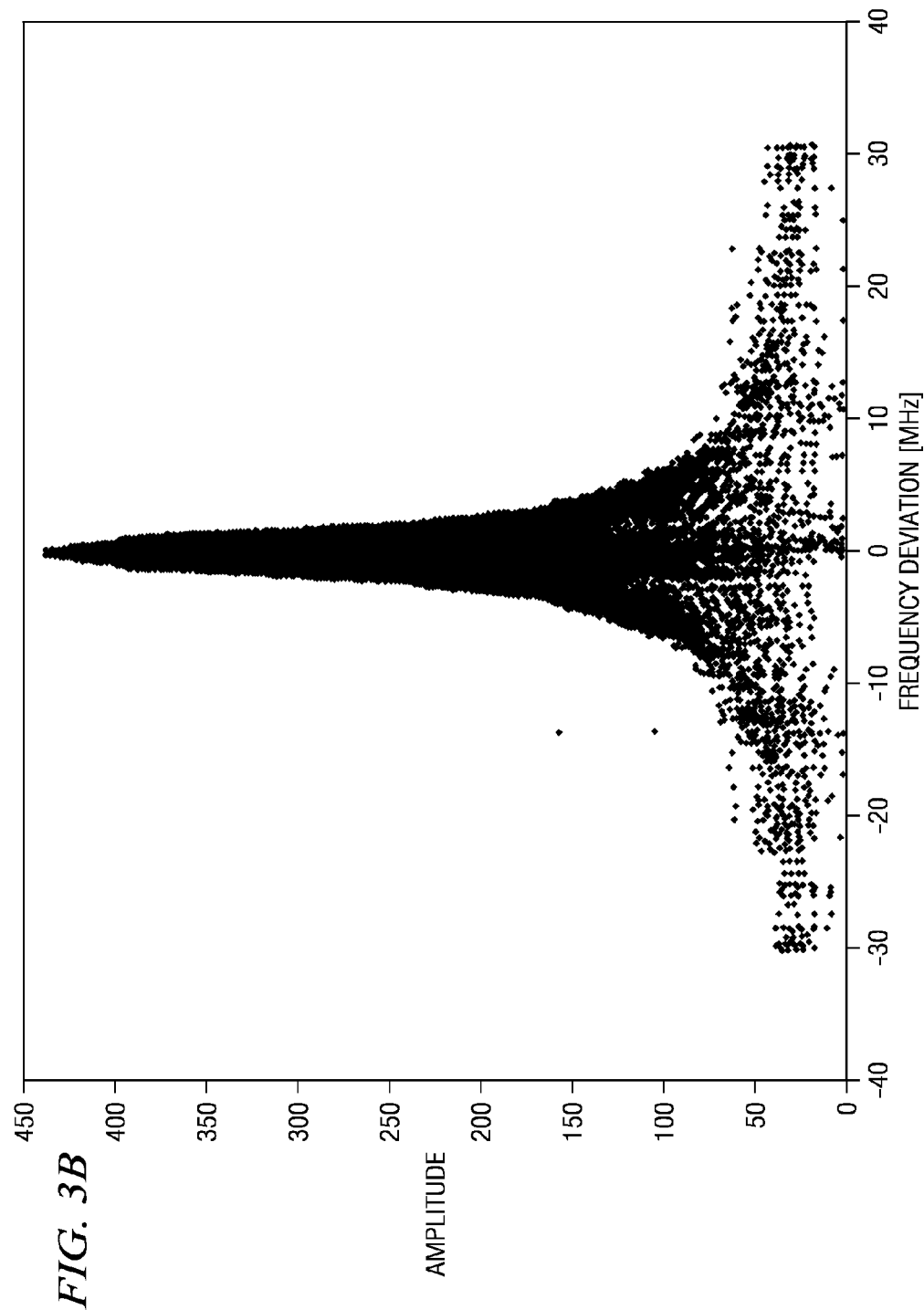
FIG. 3B is a plot of the instantaneous amplitude versus frequency deviation.
Figure 3C:
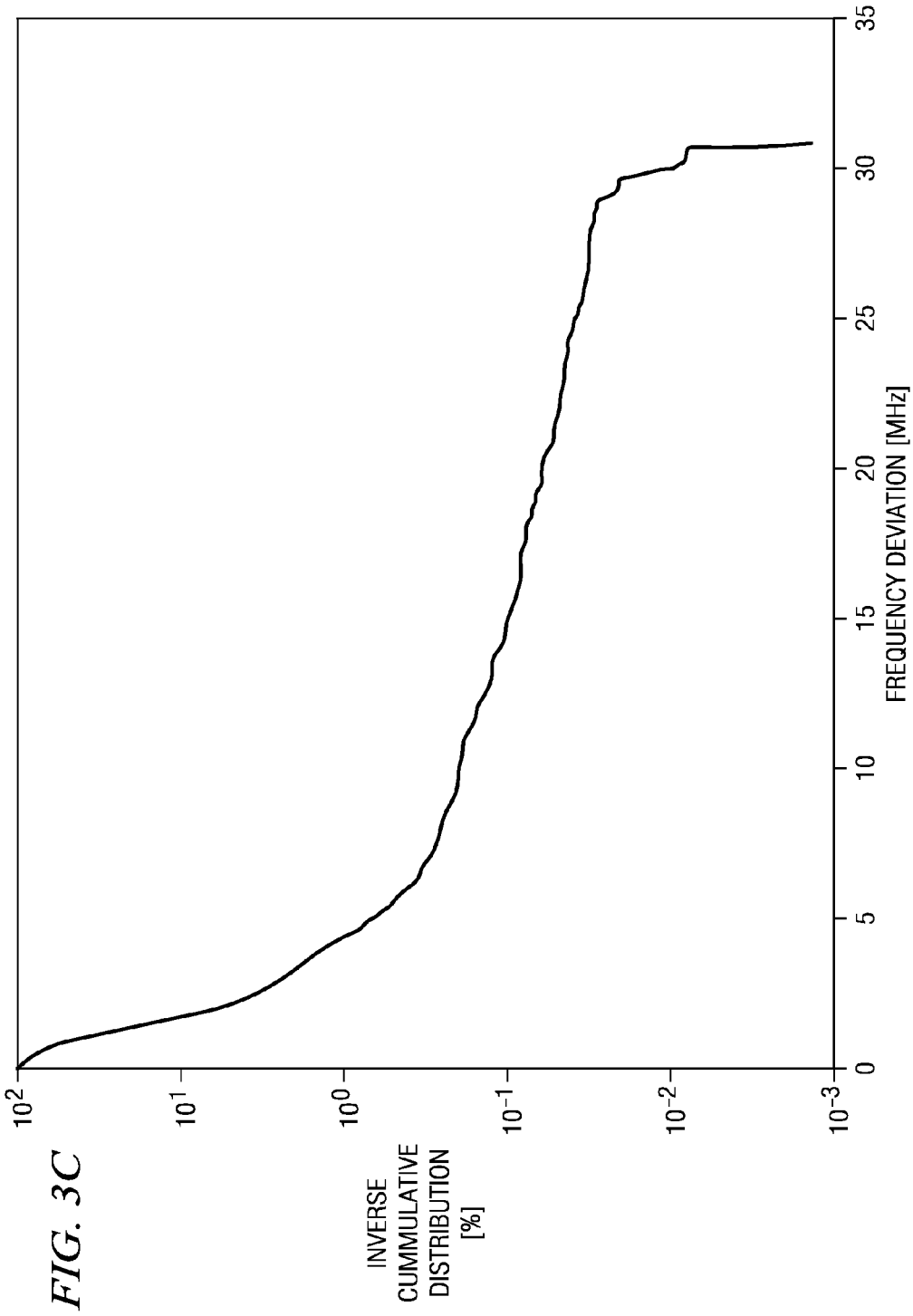
FIG. 3C is a plot of the inverse cumulative probability distribution as a function of frequency deviation.

Digital I/Q modulation, on the other hand, has the same disadvantages of the amplitude modulation part of polar transmission, and has I and Q summed together without the benefits of the fine frequency resolution of the polar modulator. Consequently, a quadrature structure of comparable resolution would be noisier. Additionally, the phase and amplitude mismatch of the I and Q paths can result in a severe distortion of the modulated signal when the two paths are finally recombined. In that sense, the polar structure is advantageous as it is insensitive to gain inaccuracies in the amplitude path and relatively easily achieves high accuracy in the phase/frequency path. The advantages of frequency modulation, namely a very fine step size of frequency control, however, becomes a disadvantage in cases where large frequency deviations are required to be performed (see FIG. 3A). The inverse cumulative probability distribution of the frequency deviation is shown in FIG. 3C for the sampling rate of 61.44 MHz. For example, frequency deviations greater than 7 MHz appear with a probability of 0.3%.

The Cartesian modulator, however, operates in the phase domain and can change phase instantly (e.g., within one clock cycle), so it does not suffer this limitation. Note that with digital I/Q modulation, the I and Q quadrature components are regulated digitally in an open loop system and thus typically suffer dynamic-range/accuracy limitations. This limits the accuracy in the phase domain compared to what is achievable in a polar structure where a closed loop system is used to achieve very fine frequency resolution.

The hybrid polar/Cartesian structure of the present invention combines the advantages of both polar and Cartesian modulation structures and avoids their disadvantages. The hybrid technique of the present invention utilizes a combination of an all digital phase locked loop (ADPLL) that features a wideband frequency modulation capability and a digitally controlled power amplifier (DPA) performs interpolation between 90 degree spaced quadrature phases. This structure is capable of performing either a polar operation or a Cartesian operation and can dynamically switch between them depending on the instantaneous value of the phase change. An alternative to monitoring the large instantaneous frequency deviation is to examine the small instantaneous amplitude value, since they are highly correlated, as shown in FIG. 3B. These two statistics, however, require conversion of the quadrature I/Q signals to the polar ρ/θ domain. A simple ABS(I)+ABS(Q) metric will also work well as a proxy for the amplitude and frequency deviation.

Figure 21:
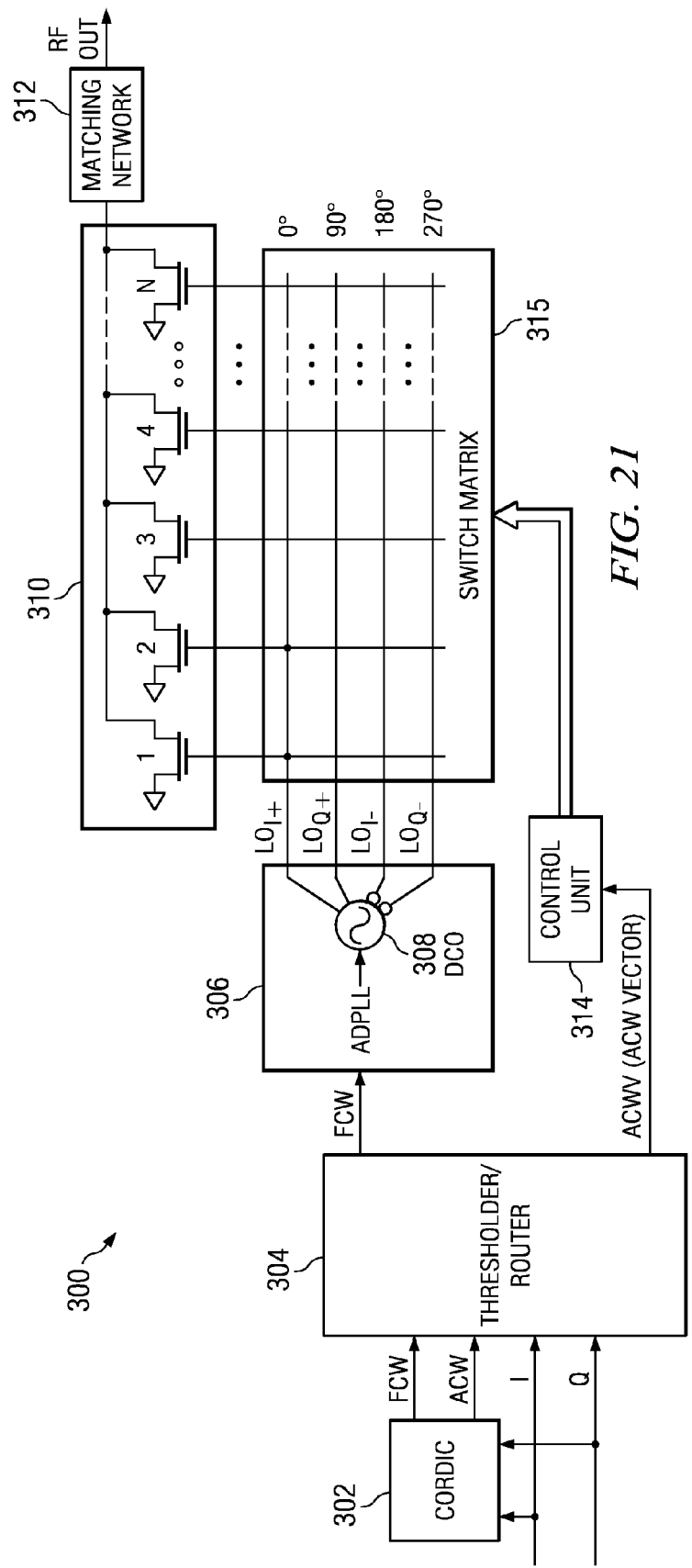
FIG. 21 is a block diagram illustrating an example embodiment of the hybrid Cartesian and polar transmitter constructed in accordance with the present invention.

A block diagram illustrating an example embodiment of the hybrid Cartesian and polar transmitter constructed in accordance with the present invention is shown in FIG. 21. The hybrid polar/Cartesian modulation circuit, generally referenced 300, comprises a CORDIC 302, thresholder/router 204, ADPLL 306 and DCO 308, control unit 314, switch matrix 315, transistor array 310 and matching network 312. The DCO is operative to output quadrature phases separated by 90°, namely $LO_{I+}$ (0°), $LO_{Q+}$ (90°), $LO_{I-}$ (180°), $LO_{Q-}$ (270°). Each intersection of a phase line and transistor line within the switch matrix denotes an AND gate or an equivalent switching point. The two inputs to each gate comprise the phase line and a control line from the control unit 314. The output of the logic gates in each column are coupled to the gate of the particular transistor in the transistor array 310.

The switch matrix determines the 'intelligence' of the operation. At each clock cycle, the control unit selects either polar or Cartesian operation, or their combination with a certain proportionality factor, and outputs the appropriate control signals to the switch matrix. Polar operation, i.e. amplitude modulation-only operation, is obtained when all transistors in the transistor array are connected to the same DCO output phase or are connected to the two DCO output phase lines but the selection does not change from the previous cycle. In this case, the RF output amplitude is constant (even possibly interpolated between the two quadrature phases) and only the phase/frequency is allowed to change. The actual phase is not critical as the different phases are relative to each other. In this AM-only case, there is no interpolation (or fixed time-invariant interpolation, when two phases are used) between the phases and the output power is proportional to the number of active transistors. Power subtraction is possible by turning on transistors of the opposite phase, e.g., $LO_{I+}$ and $LO_{I-}$. This may be useful in controlling carrier leakage. It might further be useful in providing a negative offset when a MASH ΣΔ modulator is used.

Figure 20B:
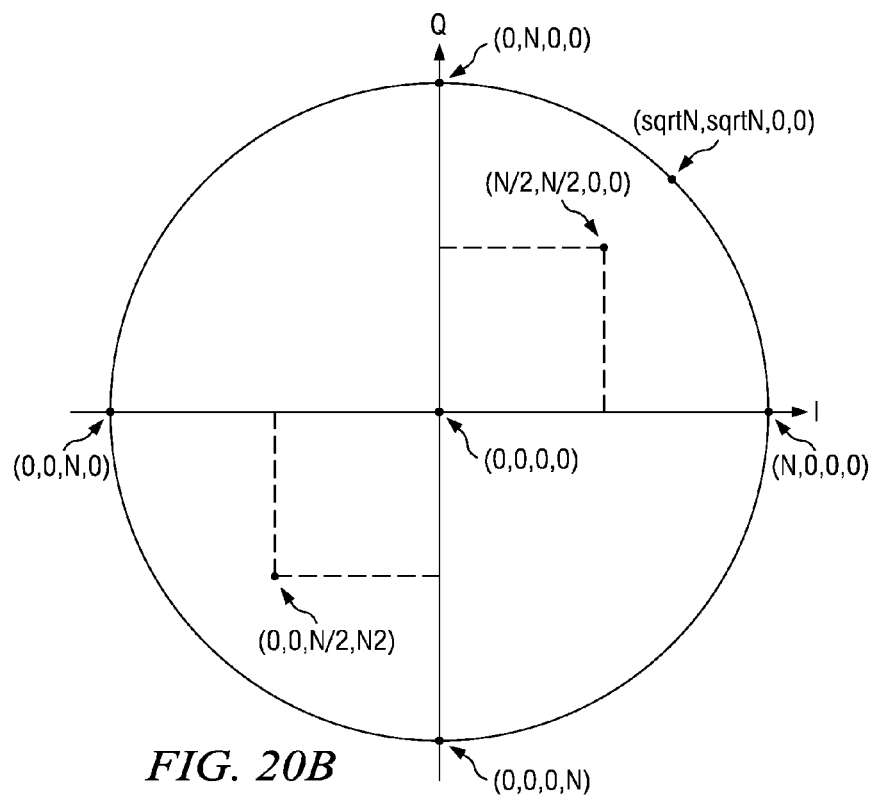

Cartesian operation is achieved when the active transistors in the transistor array are connected to different DCO output phases and their relative contributions are allowed to change. Interpolation between phases is achieved when engaging transistors from both phases that have quadrature relationship, e.g., $LO_{I+}$ and $LO_{Q+}$. As an example of digital I/Q operation, with reference to FIG. 20B, consider a point (N, 0, 0, 0) on the I axis. To switch 90° forward requires traveling along the circle to the point (0, N, 0, 0) on the Q axis. Considering N=1000 transistors, the 90° move entails switching 1000 transistors from the $LO_{I+}$ phase line to the $LO_{Q+}$ phase line. Thus, 1000 transistors are switched within the switch matrix instantaneously within one clock cycle from $LO_{I+}$ to $LO_{Q+}$ resulting in an instantaneous phase shift of 90°.

For a 45° move, for example, the DCO outputs four phases separated by 90°. Thus to get to (N/2, N/2, 0, 0), and assuming N=1000 transistors, 500 transistors are connected to the $LO_{I+}$ phase line and 500 transistors are connected to the $LO_{Q+}$ phase line. The transistor array is operative to perform interpolation on the phase outputs. When the $LO_{I+}$ and $LO_{Q+}$ transistors, for example, are merged together, interpolation is performed, i.e. by vector addition the amplitude will be $\sqrt{2}$ if there are an equal number of transistors, and the phase will be exactly half.

The thresholder/router determines the phase change Δθ (i.e. the integrated frequency deviation $\Delta f=\Delta\theta/\Delta T_s$ within the given clock cycle $T_s$) and compares it to a threshold that may be set a priori, computed dynamically, etc. depending on the application. If the phase change is smaller than or equal to the threshold, than the control unit generates the appropriate control signals to the switch matrix to pass through the I and Q signals in order to perform polar modulation on the data. The polar modulation is also known as ρ/θ modulation where ρ denotes the amplitude and θ denotes the phase.

Note that the thresholder/router can be adapted to detect and measure any suitable generic metric or statistic. Several examples of metrics include, but are not limited to, phase, amplitude, some linear or nonlinear combination of I and Q signals, or any combination of the above. For illustration purposes only, in the examples provided herein, the thresholder/router is adapted to measure phase changes. It is not intended that the invention be limited to measurement of phase changes. It is appreciated by one skilled in the art that the thresholder/router can be adapted to measure other metrics as well without departing from the scope of the invention.

If the phase change is larger than the threshold, then the control unit generates the appropriate control signals to pass the frequency and amplitude signals in order that the switch matrix performs Cartesian modulation on the data. In order to prevent glitches during the polar/Cartesian switching, the thresholder/router circuitry and the control unit (CU) are configured to have memory of the previous states in both I/Q and ρ/θ domains in order to maintain continuity of the trajectory. For example, if the previous state resulted in I=500 and Q=500 transistors, and the current clock cycle requires the polar operation, the number of transistors will be proportionately changed so that their ratio normally stays the same in order to maintain the same phase shift contribution from the DPA. The main phase shift contribution is carried out by the ADPLL.

The switch matrix controls dynamic element matching (DEM), which is possible due to the unit-weighted coding being a consequence of the unit-sized transistors. It takes advantage of the fact that the transistors are not associated with any clock phase, so they could be randomly or cyclically reassigned to different phases in order to spread out their mismatches among the four phases. This is especially important during I/Q mode of operation, where the amplitude and phase mismatches of the I/Q paths can result in distortion of the modulated signal. In this case, the active transistors can be reassigned to both I and Q paths in a time shared manner. The DEM operation is best performed simultaneously over the four quadrature phases. A constraint of at most one switch, however, connected to a given transistor must be always satisfied. The DEM operation provides randomization of the transistors over time and the phases such that the transistor mismatch error is spread out as background noise. A given transistor is to be shared between phases.

A block diagram illustrating the digital power amplifier (DPA) with a pseudo-differential output is shown in FIG. 21. In this alternative embodiment, the modulation circuit, generally referenced 320, comprises a DCO 322, control unit 327, switch matrix 326, two transistor arrays 323, 329 and two matching networks 324, 328. The differential output is produced by recognizing the fact that there are four phases output of the DCO. From the interpolation, however, only two phases are needed (depending on the quadrant). For example, quadrant 1 uses $LO_{I+}$ and $LO_{Q+}$ while quadrant 4 uses $LO_{I+}$ and $LO_{Q-}$. In each case, two of the phases are not used. Thus, the unused opposite switches in the matrix are input to the second transistor array 329 which generate a negative output resulting in a pseudo differential output from the modulator. The advantage of a differential structure is the increased gain because signals can travel between 0,0 and +1, −1 and −1, +1 to achieve double the amplitude resulting in an additional 6 dB of gain. Further, the differential output signal is less susceptible to common mode noise.

Figure 22:
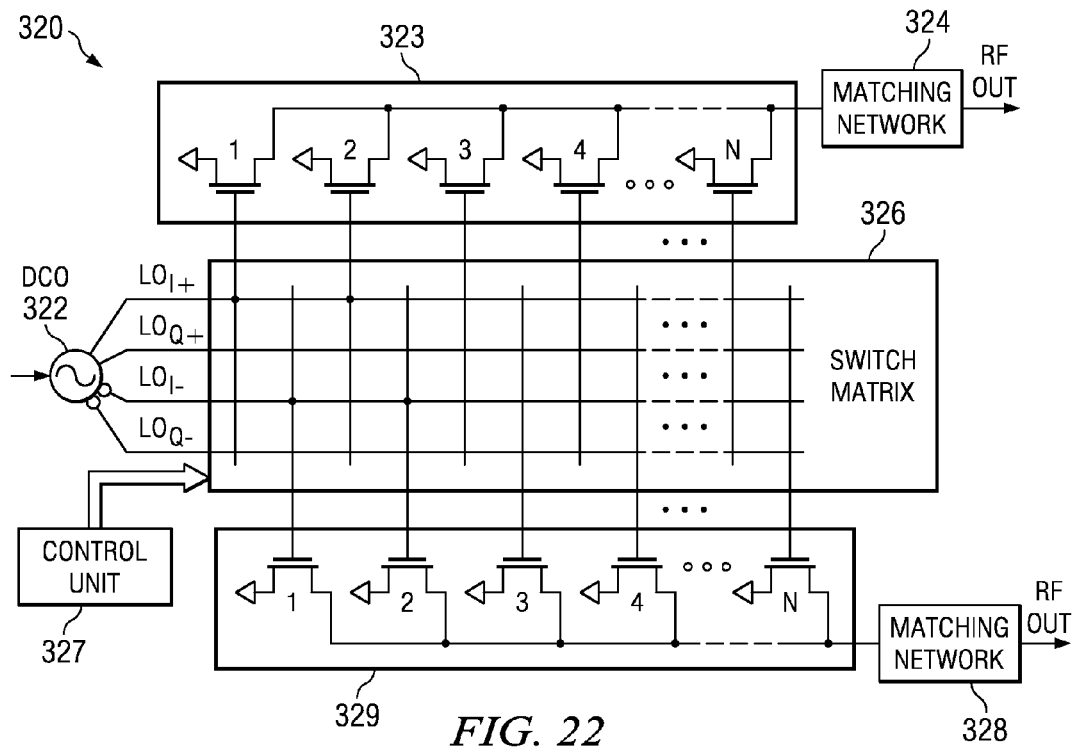
FIG. 22 is a block diagram illustrating the digital power amplifier (DPA) with a pseudo-differential output.

A block diagram illustrating the DPA with an attenuator row is shown in FIG. 22. In this alternative embodiment, the modulation circuit, generally referenced 330, comprises a DCO 332, control unit 339, switch matrix 338, transistor array 334 and matching network 336. The switch matrix comprises an attenuator row 337 which is used to shunt some of the unused transistors in the transistor array to reduce the output amplitude and the carrier feed through and ultimately to increase dynamic range of the output. The control unit 339 is adapted to control the attenuator row in the switch matrix as it has knowledge of which transistors are being used during any one clock cycle. One application of the use of the attenuator row is in WCDMA systems which has a 90 dB dynamic range requirement. Using this scheme, gates of the unused transistors are connected to logic '1' thus attenuating both the output power and any leakage.

Figure 23:
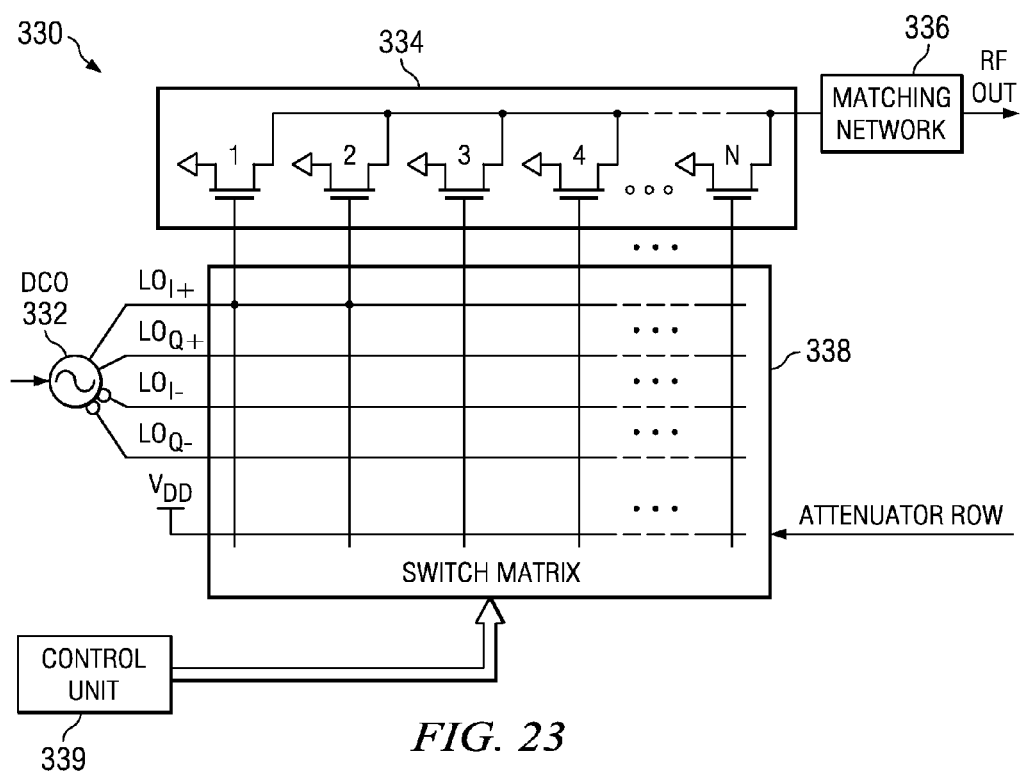
FIG. 23 is a block diagram illustrating the DPA with an attenuator row.
Figure 24:
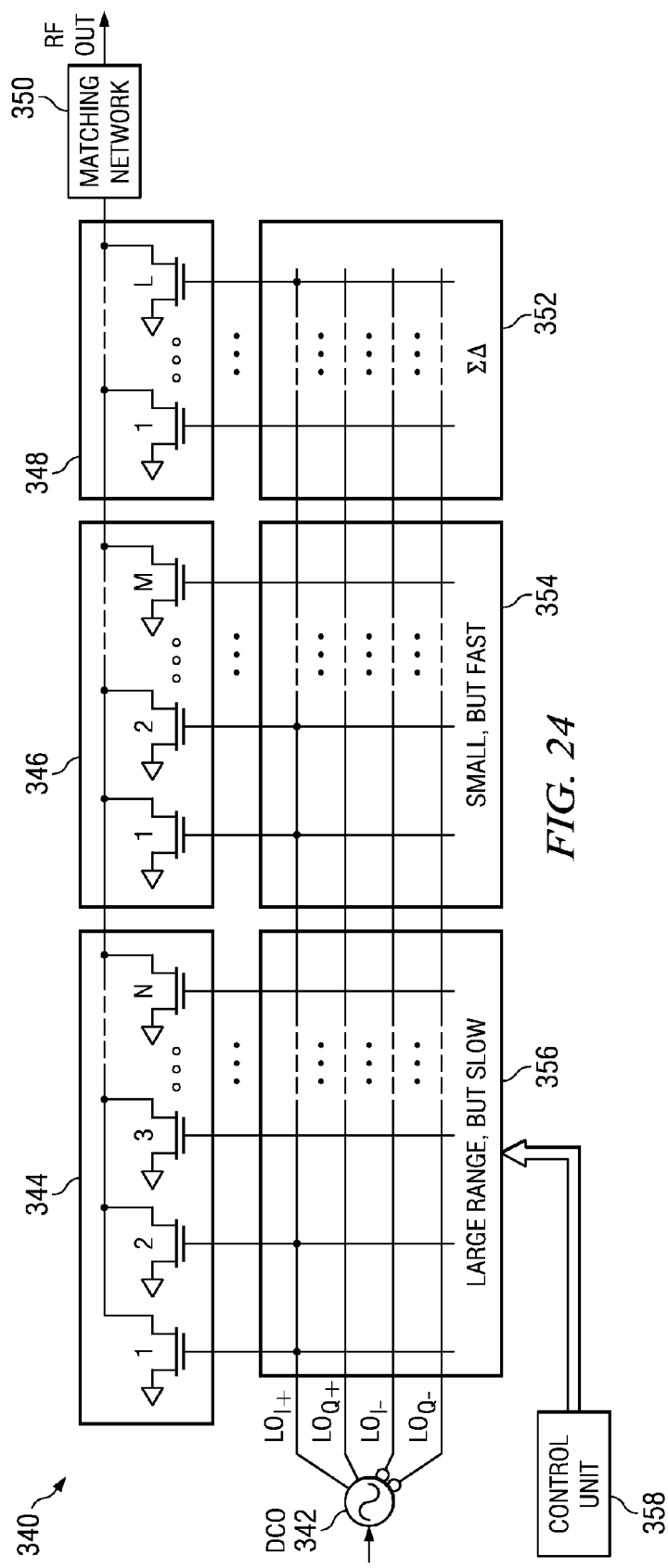
FIG. 24 is a block diagram illustrating the DPA with multiple transistor banks.

A block diagram illustrating the DPA with multiple transistor banks is shown in FIG. 23. In this alternative embodiment, the modulation circuit, generally referenced 340, comprises a DCO 342, control unit 358, a plurality of switch matrixes 356, 354, 352, a plurality of transistor arrays 344, 346, 348 and matching network 350. The switch matrix structure and transistor array are split into several parallel structures due to the fact that it is difficult to control large (e.g., N=1024) column size at high speed. In the example embodiment described herein, the switch matrix structure and transistor array are split into three portions as follows: (1) a matrix and array adapted to handle large dynamic range but low slowly varying signal, (2) a matrix and array adapted to handle small dynamic range but quickly varying signal, and (3) a matrix and array adapted to handle very small dynamic range but ultra fast varying signal. The underlying principle is that the modulating data is bandwidth limited. Consequently, a large range is needed for the slowly varying signal component and a fast varying signal component has a limited range. The ultra-fast component is typically not dictated directly by the data, but by other techniques, such as $\Sigma\Delta$ dithering to improve the resolution.

Figure 25:
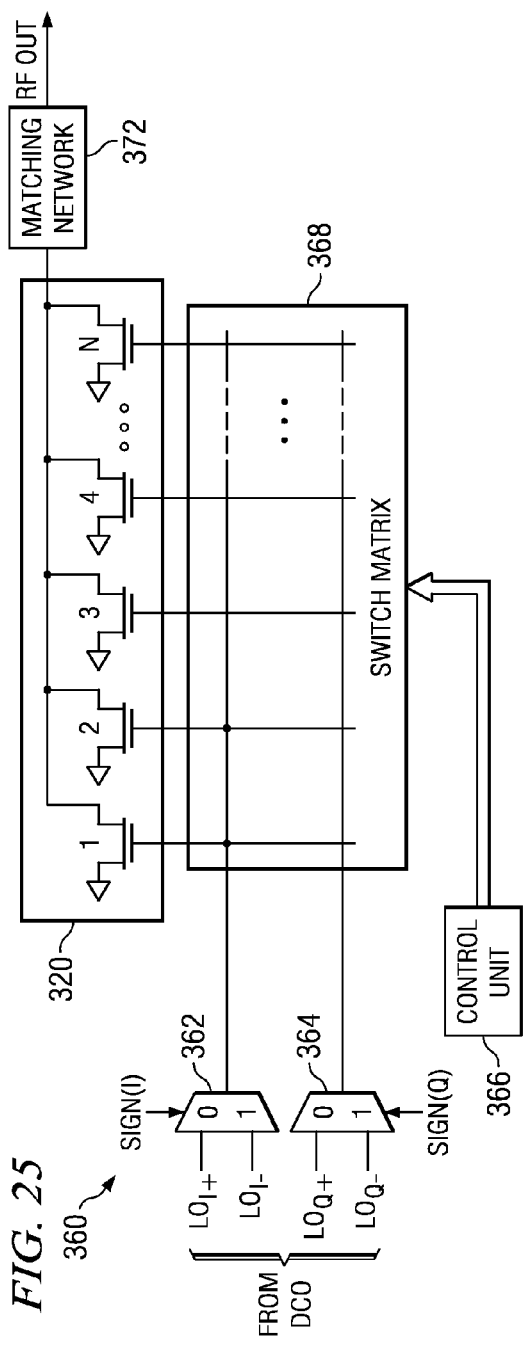
FIG. 25 is a block diagram illustrating the DPA incorporating a reduced complexity switch matrix.

A block diagram illustrating the DPA incorporating a reduced complexity switch matrix is shown in FIG. 25. In this alternative embodiment, the modulation circuit, generally referenced 360, comprises a pair of multiplexers 362, 364, control unit 366, switch matrix 368, transistor array 370 and matching network 372. The reduced complexity switch matrix comprises only two rows for I and Q.

As described hereinabove, only $LO_{I+}$ or $LO_{I-}$ is normally used during a given time instance. Similarly, only $LO_{Q+}$ or $LO_{Q-}$ is selected during a given time instance. Consequently, it is possible to reduce the switch matrix complexity by performing the multiplex selection between the DCO and the switch matrix. Two control signals that indicate the $LO_{I+}/LO_{I-}$ and $LO_{Q+}/LO_{Q-}$ selections are generated based on the I/Q quadrant location. In particular, an 'I' multiplexer 362 receives the $LO_{I+}$ and $LO_{I-}$ clock signals from the DCO wherein the select is controlled by the sign of I (i.e. the particular quadrant). A positive I steers the $LO_{I+}$ clock to the switch matrix while a negative I steers $LO_{I-}$ clock. Similarly, a 'Q' multiplexer 364 receives the $LO_{Q+}$ and $LO_{Q-}$ clock signals from the DCO. The select is controlled by the sign of Q (i.e. the particular quadrant). A positive Q steers the $LO_{Q+}$ clock to the switch matrix while a negative Q steers $LO_{Q-}$ clock.

Figure 26:
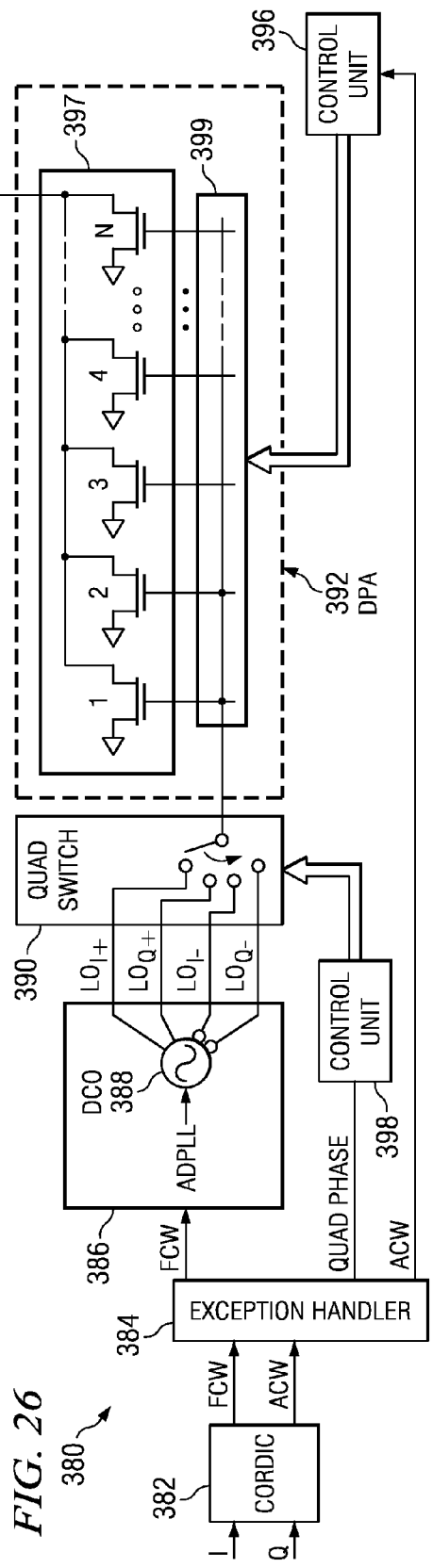
FIG. 26 is a block diagram illustrating a reduced complexity DPA with the I/Q interpolation circuitry removed.

It is possible to further reduce hardware complexity by eliminating the I/Q interpolation circuitry by only allowing 90 degree phase jumps during the large frequency deviation exceptions. A block diagram illustrating a reduced complexity DPA with the I/Q interpolation circuitry removed is shown in FIG. 26. The DPA, generally referenced 380, comprises a cordic 382, exception handler 382, ADPLL 386 with DCO 388, quad switch (e.g., a four input multiplexer dynamically selecting only one DCO phase) 390, DPA 397 made up of switch matrix 399 and transistor array 397, matching network 294 and control units 396, 398. In this embodiment, only a single row is needed in the switch matrix since the quad switch is operative to select one of the four I/Q phases.

In this alternative embodiment, a phase residue is generated which is the difference of the new phase during the I/Q operation clock cycle and the nearest quadrature phase (i.e. 0, 90, 180 or 270 degrees). This phase residue must be compensated for by the ADPLL. Notwithstanding the need for compensation by the ADPLL, this embodiment has the benefit of limiting the maximum phase change to half of 90 degrees.

Figure 27:
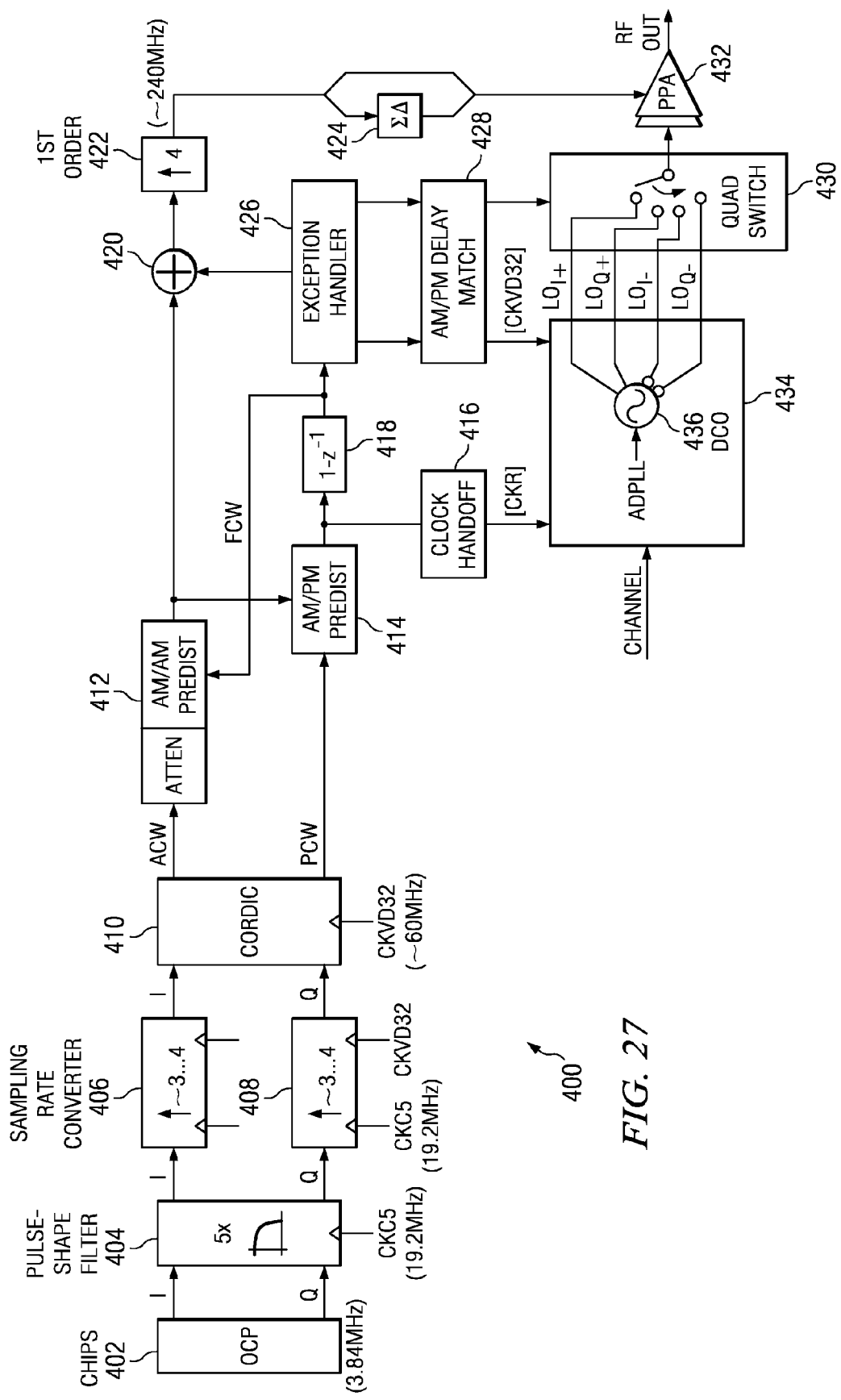
FIG. 27 is a block diagram illustrating a UMTS transmitter combining WCDMA and GSM/GPRS/EDGE (G/G/E) modes of operation.

A block diagram illustrating a UMTS transmitter combining WCDMA and GSM/GPRS/EDGE (G/G/E) modes of operation is shown in FIG. 27. The transmitter, generally referenced 400, comprises an Open Core Protocol (OCP) bus 402, I and Q pulse shaping filter 404, I and Q sampling rate converter 406, 408, cordic 412, AM/AM amplitude predistortion 412, AM/PM phase predistortion 414, differentiator (i.e. difference between current and previous samples) 418, exception handler 416, AM/PM delay match 428, clock handoff 416, summer 420, upsampling by four 422, $\Sigma\Delta$ dithering 424, ADPLL 434 and DCO 436, quad switch 430 and PPA 432.

This alternative embodiment, is based on the above principle of exception handling, which limits the maximum phase deviation within a single clock cycle to 90 degrees. The output of the AM/AM (amplitude) predistortion block 412 and AM/PM (phase) predistortion block 414 are also supplied to a G/G/E back-end. The Cordic 410 operates on the DCO integer-N down-divided clock CKVD32. The sampling rate conversion 406, 408 is done after the pulse-shape filtering 404. This ensures that the subsequent AM and PM path processing is synchronous to the RF cycle and the DCO clock. The discrete-time handoff between the AM and PM control codes and the DCO and PPA circuits will be invariant to the channel frequency. This way, generation of the extra spur will be avoided. This scheme, however, requires the clock handoff circuitry for the FCW compensating path of the ADPLL, which operates at the CKR clock rate.

In an alternative embodiment, the hybrid polar/Cartesian modulation structure of the present invention can be used in a multi-mode radio (or software defined radio) whereby polar/Cartesian operation can be enabled and disabled based on the particular desired modulation scheme. For example, consider a multi-mode radio where both GSM/EDGE and WCDMA are supported. Based on some criteria, the radio selects either GSM/EDGE or WCDMA mode of operation. When the radio is in the GSM operating mode, the polar modulation block alone is sufficient. The Cartesian (i.e. quadrature) modulation block used for phase interpolation is disabled. When the radio is switched to WCDMA operating mode, the Cartesian modulation block is activated. In this latter case, both the polar and Cartesian modulation blocks are used in accordance with the hybrid polar/Cartesian modulation scheme of the present invention described supra. Thus, depending on the communications standard selected, polar modulation alone, Cartesian modulation alone or a hybrid combination of polar/Cartesian modulation may be selected.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of hybrid polar/Cartesian modulation, said method comprising the steps of:
receiving I and Q input signals representing data to be transmitted;
generating a frequency control word and amplitude control word from said I and Q input signals, said frequency control word and said amplitude control word operational to perform polar modulation;
determining a metric and comparing said metric to a threshold; and
performing either said polar modulation or Cartesian modulation on said input signal in accordance with said comparison.

2. The method according to claim 1, further comprising the step of performing a combination of polar modulation and Cartesian modulation depending on the value of said metric.

3. The method according to claim 1, further comprising the step of storing a previous state in polar and Cartesian domains so as to maintain continuity of signal trajectory.

4. The method according to claim 1, wherein said step of determining comprises determining said metric based on said frequency control word, said amplitude control word and said I and Q input signals.

5. The method according to claim 1, adapted to be implemented in an Application Specific Integrated Circuit (ASIC).

6. The method according to claim 1, adapted to be implemented in a Field Programmable Gate Array (FPGA).

7. An apparatus for hybrid polar/Cartesian modulation, comprising:
a converter adapted to generate first frequency control data and first amplitude control data word from I and Q input signals representing data to be transmitted;
a digitally controlled oscillator (DCO) operative to generate four quadrature phases in response to said first frequency control data;
a transistor array comprising a plurality of transistors adapted to generate an output signal whose amplitude is substantially proportional to the number of transistors active at any one time in said array;
a switch matrix adapted to couple said four quadrature phases output of said DCO to said transistor array;
a router adapted to receive said first frequency control data, said first amplitude control data and said I and Q input signals, said router operative to select either polar operation or Cartesian operation and to generate second frequency control data and second amplitude control vector data in response thereto; and
control means coupled to cordic and said switch array, said control means operative to control said switch matrix to dynamically switch between polar and Cartesian modulation in accordance with said second amplitude control vector data.

8. The apparatus according to claim 7, wherein said router is operative to determine whether to perform polar or Cartesian modulation based on said first frequency command data only.

9. The apparatus according to claim 7, wherein said router is operative to determine whether to perform polar or Cartesian modulation based on both said first frequency command data and said first amplitude command data.

10. The apparatus according to claim 7, wherein said router is operative to determine a metric based on said first frequency command data, to select polar modulation if said metric is less than or equal to a threshold and to select Cartesian modulation if said metric is greater than said threshold.

11. The apparatus according to claim 7, wherein said router is operative to determine a metric based on both said first frequency command data and said first amplitude command data, to select polar modulation if said metric is less than or equal to a threshold and to select Cartesian modulation if said metric is greater than said threshold.

12. The apparatus according to claim 7, wherein said transistor array comprises a first transistor array and a second transistor array wherein positive phases are coupled to said first transistor array and negative phases are coupled to said second transistor array resulting in a differential output signal.

13. The apparatus according to claim 7, wherein said switch matrix further comprises a plurality of attenuators, each attenuator adapted to be actively coupled to a transistor in said transistor array when none of the corresponding phases are selected to be coupled thereto.

14. The apparatus according to claim 7, wherein said switch matrix and said transistor array are divided into a plurality of parallel banks.

15. The apparatus according to claim 7, wherein said switch matrix and said transistor array are divided into three parallel banks, a first bank adapted to have a large range for slowly varying signal components, a second bank adapted to have a small range for fast varying signal components and a third bank adapted for fast sigma-delta dithering.

16. The apparatus according to claim 7, wherein said router comprises means for selecting a combination of polar operation and Cartesian operation depending on the value of said metric.

17. The apparatus according to claim 7, wherein said control means is adapted to store a previous state in polar and Cartesian domains so as to maintain continuity of signal trajectory.

18. The apparatus according to claim 7, wherein said switch matrix is adapted to perform Cartesian modulation when coupled to all four quadrature phases and the contributions from each can change dynamically.

19. The apparatus according to claim 7, wherein said switch matrix comprises dynamic element matching means for randomization of said plurality of transistors over time such that transistor mismatch error is spread out as background noise.

20. The apparatus according to claim 7, adapted to be implemented in an Application Specific Integrated Circuit (ASIC).

21. The apparatus according to claim 7, adapted to be implemented in a Field Programmable Gate Array (FPGA).

22. A modulator for hybrid polar/Cartesian modulation, comprising:
phase locked loop (PLL) means for generating quadrature phase signals in response to a frequency command; and
digital power amplifier (DPA) means for generating a radio frequency (RF) output signal in accordance with said quadrature phase signals and for dynamically switching between polar modulation operation and Cartesian modulation operation in accordance with the value of a metric based on said frequency command.

23. The modulator according to claim 22, adapted to be implemented in an Application Specific Integrated Circuit (ASIC).

24. The modulator according to claim 22, adapted to be implemented in a Field Programmable Gate Array (FPGA).

25. A modulator for hybrid polar/Cartesian modulation, comprising:
 a digital phase locked loop (DPLL) adapted to generate quadrature phase clock signals;
 a router adapted to receive a first frequency command data, a first amplitude command data and I and Q input signals, said router operative to select either polar modulation operation or Cartesian modulation operation and to generate second frequency command data and second amplitude command vector data in response thereto; and
 a digital power amplifier (DPA), comprising:
  an array of switch elements operative to generate an RF output signal proportional to the number of switch elements at any point in time;
  a switch matrix coupled to the output of said DPLL and to said array of switch elements, said switch matrix operative to couple each quadrature phase clock signal to said array of switch elements in accordance with a plurality of control signals; and
  a control unit adapted to generate said plurality of control signals in accordance with second amplitude command vector data, wherein said control unit adapted to dynamically switch between polar modulation operation and Cartesian modulation operation in response to said second amplitude command vector data.

26. The modulator according to claim 25, wherein said router comprises means for selecting a combination of polar operation and Cartesian operation depending on the value of said metric derived from said first frequency command data, said first amplitude command data and said I and Q input signals.

27. The modulator according to claim 25, wherein said control unit is adapted to store a previous state in polar and Cartesian domains so as to maintain continuity of signal trajectory.

28. The modulator according to claim 25, wherein said switch matrix is adapted to perform Cartesian modulation when coupled to all four quadrature phases of said DPLL and the contributions from each can change dynamically.

29. The modulator according to claim 25, wherein said switch matrix comprises dynamic element matching means for randomization of said switch elements over time such that switch element mismatch error is spread out as background noise.

30. The modulator according to claim 25, wherein said router is operative to determine whether to perform polar or Cartesian modulation based on said first frequency command data only.

31. The modulator according to claim 25, wherein said router is operative to determine whether to perform polar or Cartesian modulation based on both said first frequency command data and said first amplitude command data.

32. The modulator according to claim 25, wherein said router is operative to determine a metric based on said first frequency command data, to select polar modulation if said metric is less than or equal to a threshold and to select Cartesian modulation if said metric is greater than said threshold.

33. The modulator according to claim 25, wherein said router is operative to determine a metric based on both said first frequency command data and said first amplitude command data, to select polar modulation if said metric is less than or equal to a threshold and to select Cartesian modulation if said metric is greater than said threshold.

34. The modulator according to claim 25, wherein said array of switch elements comprises a first switch array and a second switch array wherein positive phases are coupled to said first switch array and negative phases are coupled to said second switch array resulting in a differential output signal.

35. The modulator according to claim 25, wherein said switch matrix further comprises a plurality of attenuators, each attenuator adapted to be actively coupled to a switch in said array of switch elements when none of the corresponding phases are selected to be coupled thereto.

36. The modulator according to claim 25, wherein said switch matrix and said array of switch elements are divided into a plurality of parallel banks.

37. The modulator according to claim 25, wherein said switch matrix and said array of switch elements are divided into three parallel banks, a first bank adapted to have a large range for slowly varying signal components, a second bank adapted to have a small range for fast varying signal components and a third bank adapted for fast sigma-delta dithering.

38. The modulator according to claim 25, adapted to be implemented in an Application Specific Integrated Circuit (ASIC).

39. The modulator according to claim 25, adapted to be implemented in a Field Programmable Gate Array (FPGA).

40. A multi-mode radio for use with a plurality of modulation schemes, comprising:
 means for realizing a polar modulation mode of operation;
 means for realizing a Cartesian modulation mode of operation;
 means for realizing a hybrid polar/Cartesian modulation mode of operation wherein polar or Cartesian modulation is dynamically selected based on the value of a metric compared to a threshold; and
 control means for selecting one of said polar modulation, said Cartesian modulation or said hybrid polar/Cartesian modulation modes of operation in accordance with a selected modulation scheme.

41. The radio according to claim 40, wherein said means for realizing a hybrid polar/Cartesian modulation mode of operation comprises:
 receiving I and Q input signals representing data to be transmitted;
 generating a frequency control word and amplitude control word from said I and Q input signals;
 determining a metric and comparing said metric to a threshold; and
 performing either polar modulation or Cartesian modulation on said input signal in accordance with said comparison.

42. The radio according to claim 40, adapted to be implemented in an Application Specific Integrated Circuit (ASIC).

43. The radio according to claim 40, adapted to be implemented in a Field Programmable Gate Array (FPGA).

* * * * *